United States Patent
Kuwabara et al.

(10) Patent No.: US 11,977,410 B2
(45) Date of Patent: May 7, 2024

(54) ELECTRONIC DEVICE

(71) Applicant: Semiconductor Energy Laboratory Co., Ltd., Atsugi (JP)

(72) Inventors: Hideaki Kuwabara, Kanagawa (JP); Masaaki Hiroki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/678,159

(22) Filed: Feb. 23, 2022

(65) Prior Publication Data
US 2022/0283654 A1 Sep. 8, 2022

Related U.S. Application Data

(63) Continuation of application No. 16/025,064, filed on Jul. 2, 2018, now Pat. No. 11,262,795, which is a continuation of application No. 14/882,842, filed on Oct. 14, 2015, now abandoned.

(30) Foreign Application Priority Data

Oct. 17, 2014 (JP) .................................. 2014-213097

(51) Int. Cl.
*G06F 1/16* (2006.01)
*G04B 19/00* (2006.01)

(52) U.S. Cl.
CPC .............. *G06F 1/163* (2013.01); *G04B 19/00* (2013.01); *G06F 1/1652* (2013.01)

(58) Field of Classification Search
CPC .............................. G06F 1/163; G06F 1/1652
See application file for complete search history.

(56) References Cited

U.S. PATENT DOCUMENTS

| | | | |
|---|---|---|---|
| 5,357,061 | A | 10/1994 | Crutchfield |
| 5,776,797 | A | 7/1998 | Nicewarner, Jr. et al. |
| 6,664,005 | B2 | 12/2003 | Kezuka et al. |
| 6,754,069 | B2 | 6/2004 | Harada |
| 6,841,855 | B2 | 1/2005 | Jaeck et al. |

(Continued)

FOREIGN PATENT DOCUMENTS

| | | |
|---|---|---|
| CN | 102855821 A | 1/2013 |
| CN | 203327079 U | 12/2013 |

(Continued)

OTHER PUBLICATIONS

International Search Report (Application No. PCT/IB2015/057678) dated Jan. 26, 2016.

(Continued)

*Primary Examiner* — Nidhi Thaker
(74) *Attorney, Agent, or Firm* — Fish & Richardson P.C.

(57) ABSTRACT

A novel electronic device is provided. Alternatively an electronic device of a novel embodiment is provided. An electronic device includes a support and a display portion. The support has a first curved surface. The display portion is provided over the support. The display portion has a top surface and a side surface in contact with at least one side of the top surface. The side surface has a second curved surface. The top surface includes a first display region. The side surface includes a second display region. The first display region and the second display region are continuously provided.

13 Claims, 27 Drawing Sheets

(56) References Cited

U.S. PATENT DOCUMENTS

| | | |
|---|---|---|
| 6,903,794 B2 | 6/2005 | Fukuta et al. |
| 7,020,270 B1 | 3/2006 | Ghassabian |
| 7,115,980 B2 | 10/2006 | Miyagawa et al. |
| 7,203,057 B2 | 4/2007 | Lin |
| 7,460,085 B2 | 12/2008 | Ishii |
| 7,593,234 B2 | 9/2009 | Okuda |
| 7,722,245 B2 | 5/2010 | Baba et al. |
| 8,063,400 B2 | 11/2011 | Sugimoto |
| 8,130,484 B2 | 3/2012 | Koga et al. |
| 8,319,725 B2 | 11/2012 | Okamoto et al. |
| 8,384,840 B2 | 2/2013 | Mishima |
| 8,405,193 B2 | 3/2013 | Schaepkens et al. |
| 8,415,208 B2 | 4/2013 | Takayama et al. |
| 8,427,420 B2 | 4/2013 | Yamazaki et al. |
| 8,497,951 B2 | 7/2013 | Kobayashi |
| 8,498,406 B2 | 7/2013 | Ghassabian |
| 8,516,728 B2 | 8/2013 | Jung |
| 8,576,209 B2 | 11/2013 | Miyaguchi |
| 8,593,061 B2 | 11/2013 | Yamada |
| 8,610,118 B2 | 12/2013 | Yamazaki et al. |
| 8,610,155 B2 | 12/2013 | Hatano et al. |
| 8,665,236 B2 | 3/2014 | Myers |
| 8,698,776 B2 | 4/2014 | Kurashima |
| 8,736,162 B2 | 5/2014 | Jin et al. |
| 8,810,508 B2 | 8/2014 | Okamoto et al. |
| 8,853,941 B2 | 10/2014 | Jung |
| 8,861,205 B2 | 10/2014 | Lee |
| 8,896,563 B2 | 11/2014 | Myers |
| 9,024,863 B2 | 5/2015 | Okamoto et al. |
| 9,047,799 B2 | 6/2015 | Yamazaki et al. |
| 9,119,293 B2 | 8/2015 | Mycroft et al. |
| 9,146,590 B2 | 9/2015 | Myers |
| 9,158,388 B2 | 10/2015 | Ghassabian |
| 9,176,535 B2 | 11/2015 | Bohn et al. |
| 9,300,775 B1 | 3/2016 | Oh et al. |
| D753,108 S | 4/2016 | Kuwabara et al. |
| 9,367,095 B2 | 6/2016 | Myers |
| 9,373,307 B2 | 6/2016 | Kim et al. |
| D763,251 S | 8/2016 | Yamazaki et al. |
| 9,406,698 B2 | 8/2016 | Yamazaki et al. |
| 9,448,592 B2 | 9/2016 | Jin et al. |
| 9,582,035 B2* | 2/2017 | Connor ............... A61B 5/4875 |
| 9,647,043 B2 | 5/2017 | Hirakata. et al. |
| 9,886,112 B2* | 2/2018 | Namkung ............... G06F 3/041 |
| 9,983,630 B2 | 5/2018 | Myers |
| 10,054,988 B2 | 8/2018 | Jin et al. |
| 10,120,410 B2 | 11/2018 | Yamazaki et al. |
| 10,170,726 B2 | 1/2019 | Yamazaki et al. |
| 10,345,860 B2 | 7/2019 | Myers |
| 10,437,283 B2 | 10/2019 | Yamazaki et al. |
| 10,474,186 B2 | 11/2019 | Yamazaki et al. |
| 10,528,084 B2 | 1/2020 | Jin et al. |
| 10,950,148 B2* | 3/2021 | Choi ..................... G04G 21/08 |
| 10,983,564 B2 | 4/2021 | Jin et al. |
| 11,112,821 B2 | 9/2021 | Yamazaki et al. |
| 11,163,182 B2 | 11/2021 | Yamazaki et al. |
| 11,243,420 B2 | 2/2022 | Yamazaki et al. |
| 2002/0050641 A1 | 5/2002 | Freeman |
| 2002/0186208 A1 | 12/2002 | Feldman et al. |
| 2003/0027369 A1 | 2/2003 | Yamazaki |
| 2003/0154680 A1 | 8/2003 | Dinwoodie |
| 2003/0201974 A1 | 10/2003 | Yin |
| 2004/0038125 A1 | 2/2004 | Kim et al. |
| 2004/0169635 A1 | 9/2004 | Ghassabian |
| 2005/0253814 A1 | 11/2005 | Ghassabian |
| 2006/0286717 A1 | 12/2006 | Solberg et al. |
| 2007/0079239 A1 | 4/2007 | Ghassabian |
| 2007/0182595 A1 | 8/2007 | Ghasabian |
| 2007/0188472 A1 | 8/2007 | Ghassabian |
| 2007/0279852 A1 | 12/2007 | Daniel et al. |
| 2008/0084657 A1* | 4/2008 | Baba ..................... G04G 17/083 <br> 361/679.01 |
| 2008/0297350 A1 | 12/2008 | Iwasa et al. |
| 2009/0146848 A1 | 6/2009 | Ghassabian |
| 2009/0156272 A1 | 6/2009 | Ohuchi et al. |
| 2010/0029327 A1* | 2/2010 | Jee ..................... G06F 1/163 <br> 345/173 |
| 2010/0039706 A1 | 2/2010 | Danner et al. |
| 2010/0052503 A1 | 3/2010 | Fukagawa |
| 2010/0065832 A1 | 3/2010 | Sugimoto |
| 2010/0117975 A1 | 5/2010 | Cho |
| 2010/0253902 A1 | 10/2010 | Yamazaki et al. |
| 2010/0317409 A1 | 12/2010 | Jiang et al. |
| 2011/0050657 A1 | 3/2011 | Yamada |
| 2011/0115364 A1 | 5/2011 | Kim |
| 2011/0128241 A1 | 6/2011 | Kang et al. |
| 2011/0134056 A1 | 6/2011 | Kim et al. |
| 2011/0157046 A1 | 6/2011 | Lee et al. |
| 2012/0244408 A1 | 9/2012 | Huang et al. |
| 2013/0002133 A1 | 1/2013 | Jin et al. |
| 2013/0002583 A1 | 1/2013 | Jin et al. |
| 2013/0021768 A1 | 1/2013 | Kim et al. |
| 2013/0076612 A1 | 3/2013 | Myers |
| 2013/0076649 A1 | 3/2013 | Myers et al. |
| 2013/0100392 A1* | 4/2013 | Fukushima ......... G02F 1/13306 <br> 445/24 |
| 2013/0107433 A1 | 5/2013 | Mycroft et al. |
| 2013/0180882 A1 | 7/2013 | Hamers et al. |
| 2013/0191741 A1 | 7/2013 | Dickinson et al. |
| 2013/0194761 A1 | 8/2013 | Kim |
| 2013/0224562 A1 | 8/2013 | Momo |
| 2014/0042406 A1 | 2/2014 | Degner et al. |
| 2014/0063719 A1* | 3/2014 | Yamazaki ............. G06F 1/1626 <br> 361/679.21 |
| 2014/0099999 A1 | 4/2014 | Hatano et al. |
| 2014/0139422 A1 | 5/2014 | Mistry et al. |
| 2014/0179225 A1 | 6/2014 | Teng et al. |
| 2014/0181750 A1 | 6/2014 | Fujiwara |
| 2014/0217382 A1 | 8/2014 | Kwon et al. |
| 2014/0218321 A1 | 8/2014 | Lee et al. |
| 2014/0240985 A1 | 8/2014 | Kim et al. |
| 2014/0247405 A1 | 9/2014 | Jin et al. |
| 2014/0254111 A1 | 9/2014 | Yamazaki et al. |
| 2014/0267091 A1 | 9/2014 | Kim |
| 2014/0306260 A1 | 10/2014 | Yamazaki et al. |
| 2014/0320435 A1* | 10/2014 | Modarres ............. G06F 1/1652 <br> 345/173 |
| 2015/0026647 A1 | 1/2015 | Park et al. |
| 2015/0029227 A1 | 1/2015 | Park et al. |
| 2015/0103023 A1 | 4/2015 | Iwaki |
| 2015/0138041 A1* | 5/2015 | Hirakata .................. G09G 5/14 |
| 2015/0138699 A1* | 5/2015 | Yamazaki ........... H01M 50/136 <br> 361/679.03 |
| 2015/0169011 A1 | 6/2015 | Bibl et al. |
| 2015/0220172 A1 | 8/2015 | Garcia et al. |
| 2015/0223355 A1* | 8/2015 | Fleck ..................... G06F 1/163 <br> 361/679.03 |
| 2015/0236052 A1 | 8/2015 | Okamoto et al. |
| 2015/0277559 A1 | 10/2015 | Vescovi et al. |
| 2015/0296635 A1 | 10/2015 | Mycroft et al. |
| 2015/0346766 A1 | 12/2015 | Justice et al. |
| 2016/0048159 A1 | 2/2016 | McCormack et al. |
| 2016/0070367 A1 | 3/2016 | Lin |
| 2016/0116941 A1 | 4/2016 | Kuwabara et al. |
| 2016/0134737 A1 | 5/2016 | Pulletikurty |
| 2016/0269515 A1 | 9/2016 | Yamazaki et al. |
| 2018/0348811 A1 | 12/2018 | Yamazaki et al. |
| 2019/0004569 A1 | 1/2019 | Jin et al. |
| 2019/0113948 A1 | 4/2019 | Yamazaki et al. |
| 2019/0155332 A1 | 5/2019 | Yamazaki et al. |
| 2019/0324503 A1 | 10/2019 | Myers |
| 2021/0240228 A1 | 8/2021 | Jin et al. |
| 2022/0035185 A1 | 2/2022 | Yamazaki et al. |
| 2022/0050496 A1 | 2/2022 | Yamazaki et al. |
| 2023/0145723 A1 | 5/2023 | Yamazaki et al. |

FOREIGN PATENT DOCUMENTS

| | | |
|---|---|---|
| CN | 103827770 A | 5/2014 |
| EP | 1137088 A | 9/2001 |
| EP | 1909253 A | 4/2008 |
| EP | 2071812 A | 6/2009 |
| EP | 2133854 A | 12/2009 |

(56) References Cited

FOREIGN PATENT DOCUMENTS

| | | | |
|---|---|---|---|
| EP | 2264895 | A | 12/2010 |
| EP | 2264896 | A | 12/2010 |
| EP | 2381341 | A | 10/2011 |
| EP | 2393203 | A | 12/2011 |
| EP | 2393204 | A | 12/2011 |
| EP | 3557373 | A | 10/2019 |
| JP | 10-224713 | A | 8/1998 |
| JP | 2001-266894 | A | 9/2001 |
| JP | 2002-229675 | A | 8/2002 |
| JP | 2002-297066 | A | 10/2002 |
| JP | 2002-366059 | A | 12/2002 |
| JP | 2005-250442 | A | 9/2005 |
| JP | 2006-005712 | A | 1/2006 |
| JP | 2006-523904 | | 10/2006 |
| JP | 2006-302204 | A | 11/2006 |
| JP | 2007-326259 | A | 12/2007 |
| JP | 2008-191256 | A | 8/2008 |
| JP | 2009-147761 | A | 7/2009 |
| JP | 2010-282181 | A | 12/2010 |
| JP | 2010-282183 | A | 12/2010 |
| JP | 2011-034029 | A | 2/2011 |
| JP | 2011-047977 | A | 3/2011 |
| JP | 2011-060576 | A | 3/2011 |
| JP | 2012-138212 | A | 7/2012 |
| JP | 2013-015835 | A | 1/2013 |
| JP | 2014-063159 | A | 4/2014 |
| JP | 2014-063723 | A | 4/2014 |
| JP | 2014-123197 | A | 7/2014 |
| JP | 2014-519626 | | 8/2014 |
| JP | 2014-160290 | A | 9/2014 |
| JP | 2014-197181 | A | 10/2014 |
| JP | 2014-534456 | | 12/2014 |
| JP | 2014-535086 | | 12/2014 |
| KR | 2014-0117824 | A | 10/2014 |
| TW | 200509773 | | 3/2005 |
| TW | 201311066 | | 3/2013 |
| TW | 201415623 | | 4/2014 |
| WO | WO-2001/031788 | | 5/2001 |
| WO | WO-2003/007288 | | 1/2003 |
| WO | WO-2004/095414 | | 11/2004 |
| WO | WO-2005/122401 | | 12/2005 |
| WO | WO-2007/114833 | | 10/2007 |
| WO | WO-2008/123416 | | 10/2008 |
| WO | WO-2011/114190 | | 9/2011 |
| WO | WO-2012/167204 | | 12/2012 |
| WO | WO-2013/048868 | | 4/2013 |
| WO | WO-2013/048881 | | 4/2013 |
| WO | WO-2014/034749 | | 3/2014 |
| WO | WO-2014/136856 | | 9/2014 |

OTHER PUBLICATIONS

Written Opinion (Application No. PCT/IB2015/057678) dated Jan. 26, 2016.
Taiwanese Office Action (Application No. 104134116) dated Nov. 25, 2019.
Taiwanese Office Action (Application No. 109124821) dated Jul. 26, 2021.
"MetaWatch Strata Smart Watch", https://gadgetsin.com/metawatch-strata-smart-watch.htm, Gadgetsin.
Taiwanese Office Action (Application No. 109124821) dated Apr. 12, 2022.

* cited by examiner

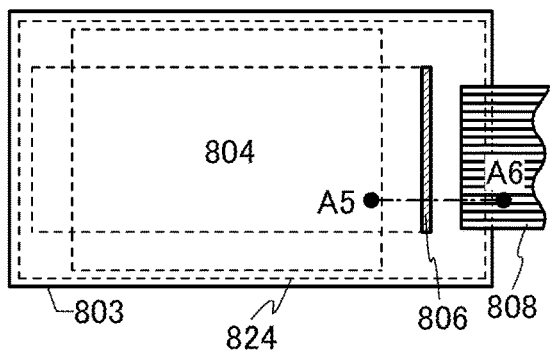
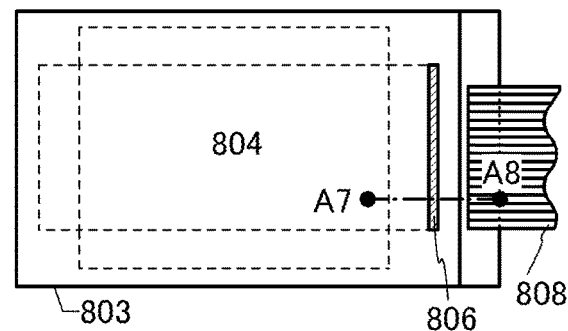
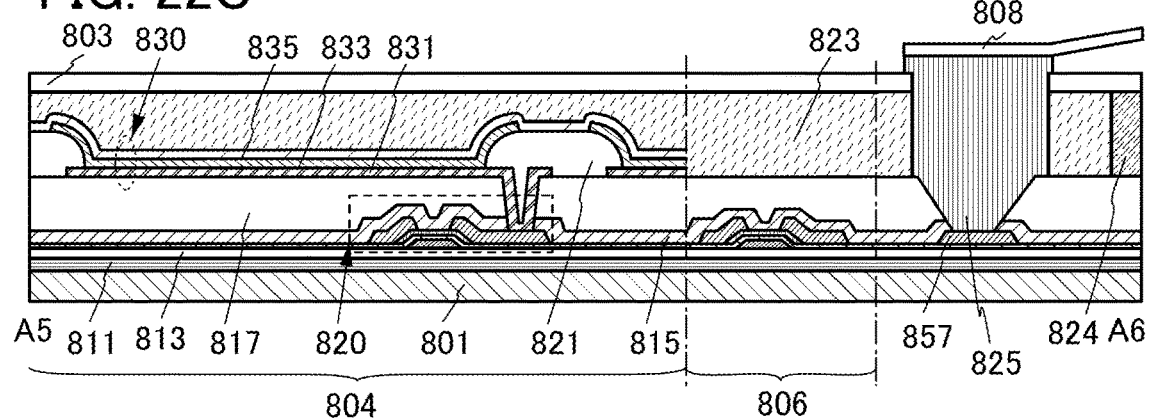
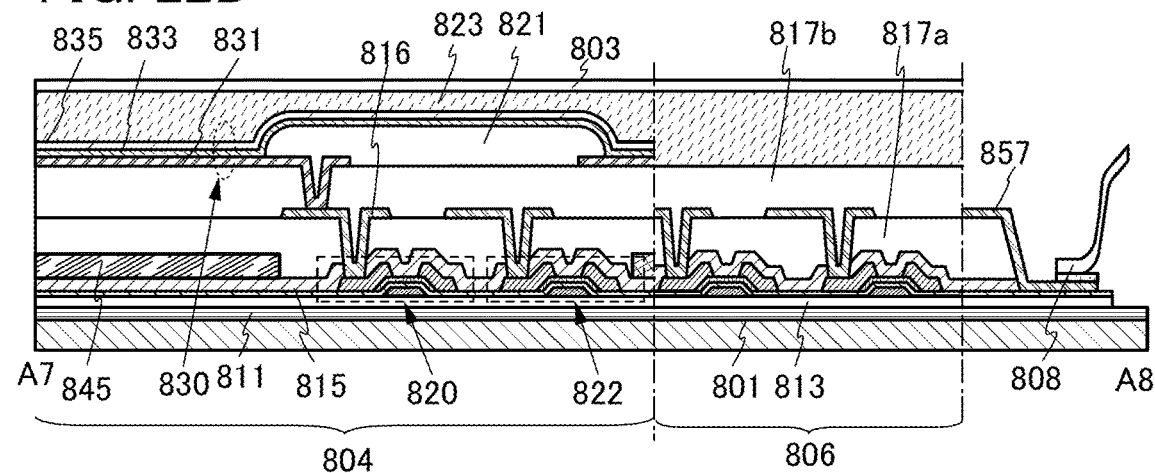
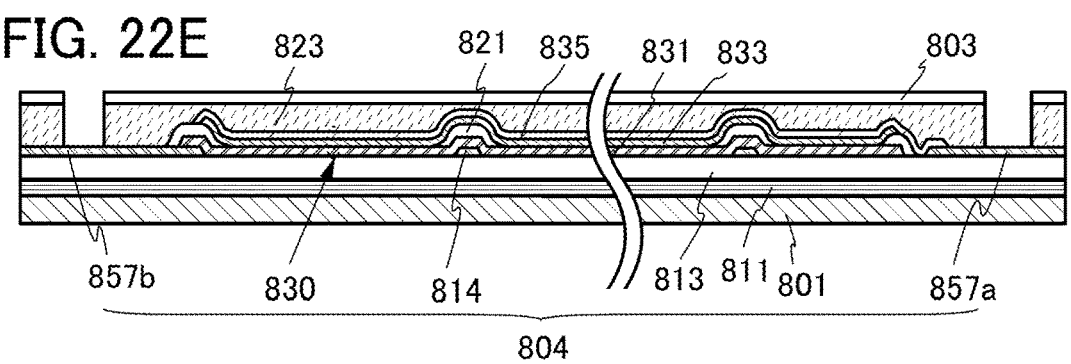

FIG. 27A
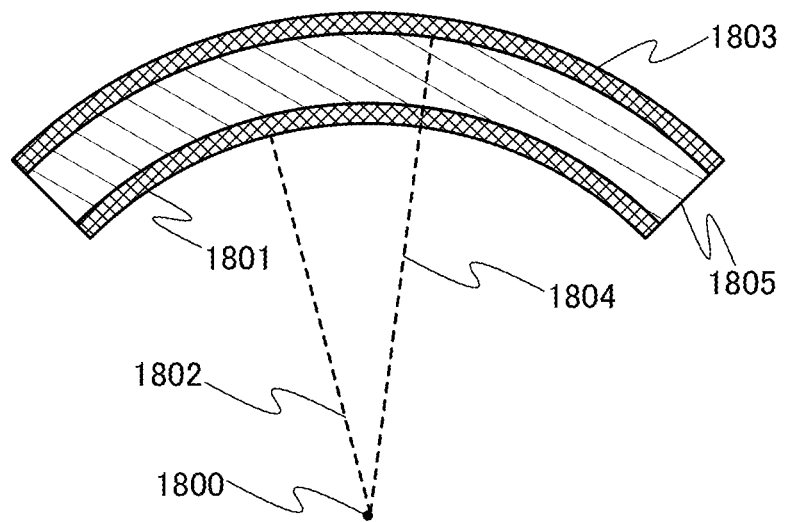
FIG. 27B
FIG. 27C
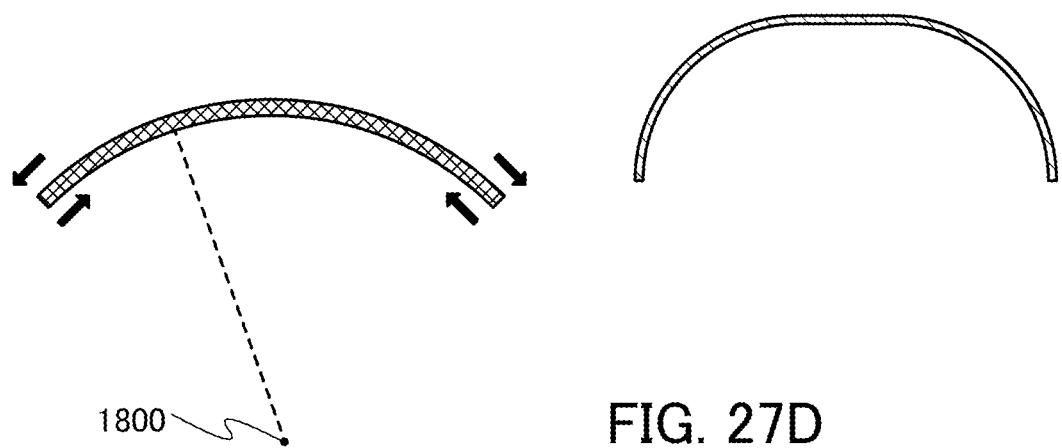
FIG. 27D

ELECTRONIC DEVICE

CROSS-REFERENCE TO RELATED APPLICATIONS

This application is a continuation of U.S. application Ser. No. 16/025,064, filed Jul. 2, 2018, now allowed, which is a continuation of U.S. application Ser. No. 14/882,842, filed Oct. 14, 2015, now abandoned, which claims the benefit of a foreign priority application filed in Japan as Serial No. 2014-213097 on Oct. 17, 2014, both of which are incorporated by reference.

TECHNICAL FIELD

One embodiment of the present invention relates to an electronic device, a display device, a light-emitting device, a power storage device, a driving method thereof, or a manufacturing method thereof.

Note that electronic devices in this specification mean all devices which operate by being supplied with electric power, and electronic devices including power sources, electronic devices and electro-optical devices including power sources such as storage batteries, information terminal devices including storage batteries, and the like are all electronic devices. Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

BACKGROUND ART

Display devices used while being worn on human bodies, such as display devices mounted on heads, have recently been developed and are referred to as head-mounted displays or wearable displays. It is desired that electronic devices used while being worn on human bodies, such as hearing aids, have a light weight and a small size.

Electronic book readers including flexible display devices are disclosed in Patent Documents 1 and 2.

REFERENCES

Patent Documents

[Patent Document 1] Japanese Published Patent Application No. 2010-282181
[Patent Document 2] Japanese Published Patent Application No. 2010-282183

DISCLOSURE OF INVENTION

In order that a user can comfortably wear a display device used while being worn on a human body, the display device needs to have a light weight and a small size, and in addition, the whole electronic device including a driver device for the display device and a power source needs to have a light weight.

Furthermore, a display device used while being worn on a human body and an electronic device including the display device need to be easily carried around and to be sturdy.

An object of one embodiment of the present invention is to provide a novel electronic device. Another object of one embodiment of the present invention is to provide an electronic device of a novel embodiment.

Another object of one embodiment of the present invention is to provide a novel display device. Another object of one embodiment of the present invention is to provide a display device of a novel embodiment.

Another object of one embodiment of the present invention is to provide an electronic device used while being worn on a human body. Another object of one embodiment of the present invention is to provide an electronic device used while being worn on an arm.

Another object of one embodiment of the present invention is to provide a display device used while being worn on a human body. Another object of one embodiment of the present invention is to provide a display device used while being worn on an arm.

Another object of one embodiment of the present invention is to provide a power storage device used while being worn on part of a human body. Another object of one embodiment of the present invention is to provide a power storage device used while being worn on an arm.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an electronic device including a support and a display portion. The support has a curved surface. The display portion is over the support. The display portion has a top surface and a side surface in contact with at least one side of the top surface. The side surface has a curved surface. The top surface includes a first display region. The side surface includes a second display region. The first display region and the second display region are continuously provided. In the above structure, the side surface preferably includes a part of a side surface of a cylinder or a part of a side surface of an elliptical cylinder.

Another embodiment of the present invention is an electronic device including a support and a display portion. The support has a curved surface. The display portion is over the support. The display portion includes a housing. The housing has a top surface and a side surface in contact with at least one side of the top surface. The top surface includes a first display region. The side surface includes a second display region. The side surface has a curved surface. The first display region and the second display region are continuously provided. In the above structure, the side surface preferably includes a part of a side surface of a cylinder or a part of a side surface of an elliptical cylinder.

In either of the above structures, it is preferable that the support have a belt-like region and the width of the belt-like region of the support be smaller than that of the display portion.

In any of the above structures, it is preferable that the electronic device include a housing and the display portion be in contact with an outer surface of the housing.

In any of the above structures, it is preferable that the support be configured to be mounted on a cylindrical object.

In any of the above structures, it is preferable that the electronic device be worn such that the support is in contact with an arm of a user.

According to one embodiment of the present invention, a novel electronic device can be provided. According to one embodiment of the present invention, an electronic device of a novel embodiment can be provided.

According to one embodiment of the present invention, a novel display device can be provided. According to one embodiment of the present invention, a display device of a novel embodiment can be provided.

According to one embodiment of the present invention, an electronic device used while being worn on part of a human body can be provided. According to one embodiment of the present invention, an electronic device used while being worn on an arm can be provided.

According to one embodiment of the present invention, a power storage device used while being worn on part of a human body can be provided. According to one embodiment of the present invention, a power storage device used while being worn on an arm can be provided.

According to one embodiment of the present invention, a display device used while being worn on a human body can be provided. According to one embodiment of the present invention, a display device used while being worn on an arm can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 16A-1, 16A-2, 16A-3, 16B-1, 16B-2, and 16B-3 are cross-sectional views illustrating a method for manufacturing an electronic device of one embodiment of the present invention;

FIGS. 22A to 22E illustrate examples of display panels of one embodiment;

FIGS. 27A to 27D illustrate the radius of curvature of a film.

BEST MODE FOR CARRYING OUT THE INVENTION

Figure 1A:
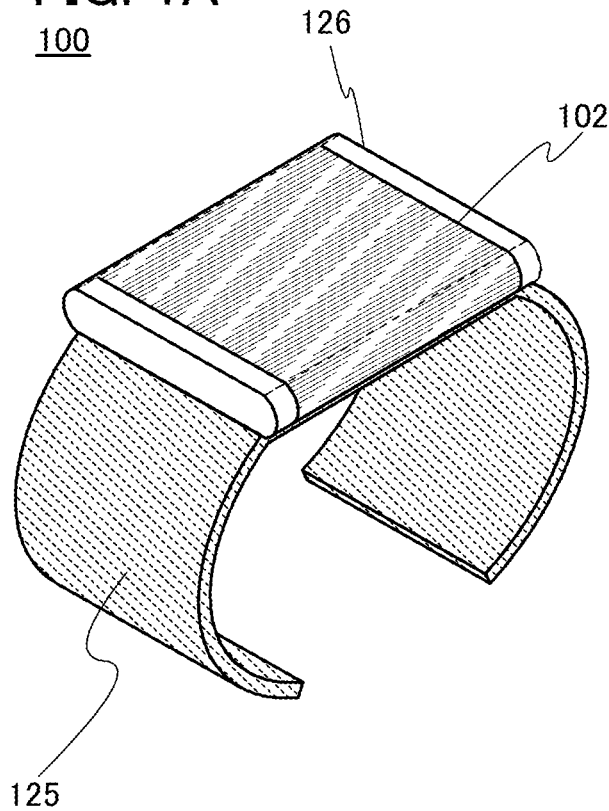
FIGS. 1A to 1D are a perspective view, a top view, and cross-sectional views illustrating an electronic device of one embodiment of the present invention.

Embodiments of the present invention will be described below in detail with reference to the drawings. Note that the present invention is not limited to the following description, and it is easily understood by those skilled in the art that modes and details disclosed herein can be modified in various ways. Further, the present invention is not construed as being limited to description of the embodiments and the examples.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, the display device might include any of the following modules in its category: a module in which a connector such as a flexible printed circuit (FPC) or a tape carrier package (TCP) is attached to a display panel (display device); a module having a TCP provided with a printed wiring board at the end thereof; and a module having an integrated circuit (IC) directly mounted by a chip on glass (COG) method over a substrate over which a display element is formed.

Embodiment 1

In this embodiment, an example of an electronic device 100 of one embodiment of the present invention is described.

Figure 1B:
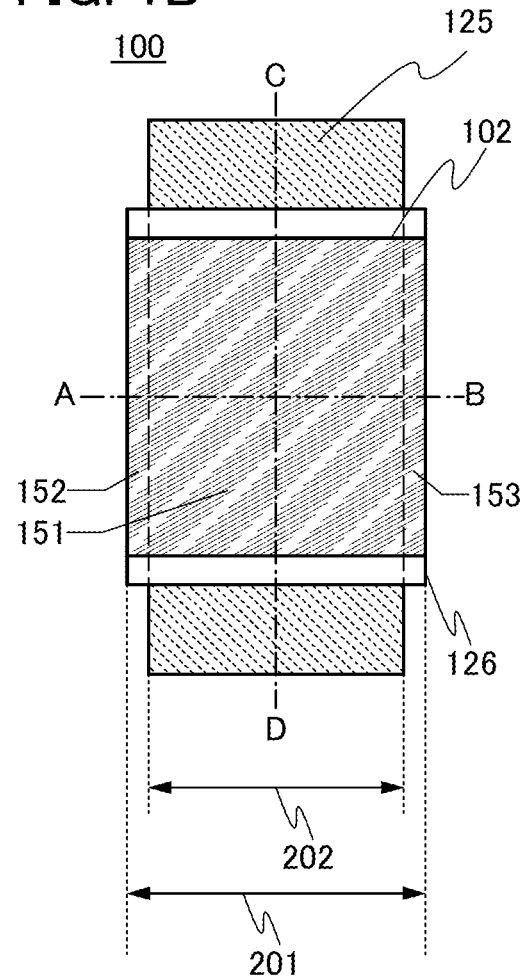
Figure 1C:
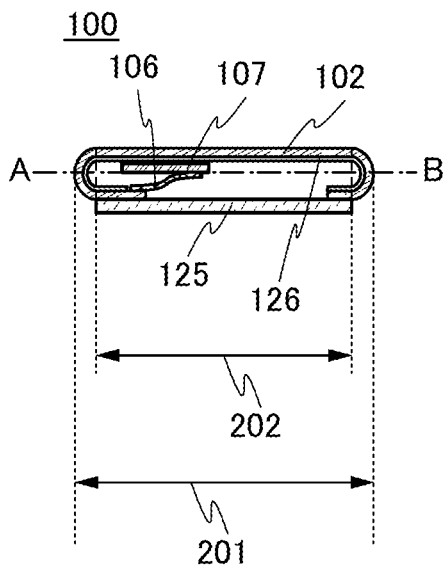
Figure 1D:
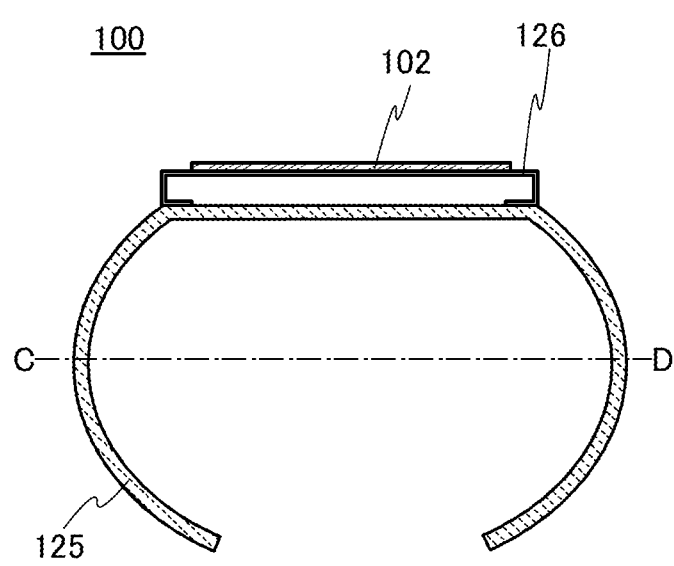

FIG. 1A is a perspective view of the electronic device 100. FIG. 1B is a top view of the electronic device 100. FIGS. 1C and 1D show cross sections taken along the dashed-dotted lines A-B and C-D in FIG. 1B, respectively. In FIG. 1B, the dashed-dotted lines A-B and C-D are roughly perpendicular to each other.

The electronic device 100 includes a display portion 102 and a support 125. The electronic device 100 may further include a housing 126.

As shown in FIGS. 1C and 1D, the display portion 102 is provided so as to be in contact with an outer surface of the housing 126, for example. In the case where the display portion 102 is provided so as to be in contact with the outer surface of the housing 126, a second housing may be further provided so as to be in contact with an outer surface of the display portion 102. Alternatively, a protective cover may be provided on the display portion 102.

The display portion 102 includes a display region over a flexible film. A light-emitting element is provided in the display region. In addition, the display portion 102 may include one or a plurality of driving circuits over the flexible film.

As shown in FIGS. 1A and 1C, the display portion 102 has a top surface and a first side surface in contact with at least one side of the top surface. The first side surface has a curved surface. The electronic device 100 may have a curved second side surface that approximately faces the first side surface. Furthermore, the display portion 102 may have a rear surface that faces part of the top surface.

The first side surface and the second side surface each may have a shape of part of a side surface of a cylinder or part of a side surface of an elliptical cylinder. The first side surface and the second side surface each may have a curved surface of which a radius of curvature continuously changes, for example. Furthermore, the first side surface and the second side surface each preferably have a curved surface such that the slope of a tangent line continuously changes from the top surface to the side surface or from the side surface to the bottom surface. It is preferable that the first side surface and the second side surface have no corner portion between the top surface and the side surface and between the side surface and the bottom surface, for example, and that these surfaces form a continuous surface.

In particular, the first side surface and the second side surface each preferably have a developable surface that is obtained by transforming a flat surface without expansion and contraction.

Here, description is given of an example in which the display portion 102 of the electronic device 100 has two side surfaces; however, the display portion 102 may have three or more side surfaces.

In FIG. 1A, a projected portion of the first side surface included in the display portion 102 is substantially perpendicular to a projected portion of a curved surface of the support 125. In FIG. 1C, the first side surface and the second side surface each have a plane that is substantially perpendicular to the dashed-dotted line A-B.

As shown in FIG. 1C, the electronic device 100 preferably includes a circuit board 106 and a circuit board 107. The circuit board 106 and the circuit board 107 are preferably positioned inside the housing 126.

As the circuit board 106, for example, a flexible printed circuit (FPC) in which a flexible resin film is provided with a wiring can be used. It is preferable that the circuit board 106 be electrically connected to, for example, the one or the plurality of driving circuits included in the display portion.

For example, in the case where the electronic device 100 includes a storage battery, it is preferable that the circuit board 107 be electrically connected to the storage battery. Furthermore, the circuit board 107 preferably includes a converter circuit for feeding power from the storage battery.

The display portion 102 includes a display panel. Furthermore, the display portion 102 preferably includes a touch sensor on its surface.

As the touch sensor included in the display portion 102, for example, a sheet-like capacitive touch sensor may be provided to overlap with the display panel. Examples of the capacitive touch sensor are a surface capacitive touch sensor and a projected capacitive touch sensor.

Further, examples of the projected capacitive type are of a self capacitive type, a mutual capacitive type, and the like mainly in accordance with the difference in the driving method. The use of a mutual capacitive type is preferable because multiple points can be sensed simultaneously.

Alternatively, as a touch sensor, a so-called in-cell touch panel that has a touch sensor function may be provided as the display panel itself. For the in-cell touch panel, a capacitive touch sensor may be used or an optical touch sensor using a photoelectric conversion element may be used.

As shown in FIG. 1D, the display portion 102 and the housing 126 are preferably provided over the support 125.

The electronic device 100 can be used while being worn on an arm of a human body or the like. As shown in FIGS. 1A and 1D, the support 125 included in the electronic device 100 preferably has a shape along an arm. The electronic device 100 may be mounted on an arm of a robot or the like. Examples of the robot include a working robot, a robot attached to an apparatus, and a humanoid robot. When the electronic device 100 is mounted on a part of a human body or the like, positional displacement hardly occurs since the electronic device 100 includes the support 125. Furthermore, the position is fixed by the support 125.

The support 125 preferably has a round shape. The support 125 preferably has a shape along a curved surface, for example. Alternatively, the support 125 preferably has a shape along a side surface of an elliptical cylinder. For example, the support 125 may partly have an arch-like shape, a C-like shape, an elliptical shape, or an elliptical shape part of which is cut. When the support 125 has such a round shape, the electronic device 100 can fit a body such as an arm more snugly. For example, the electronic device 100 can be put around an arm according to the shape of the arm. Furthermore, the support 125 may have a cross section along three sides of a quadrangle.

The support 125 may have a shape along a cylindrical object, for example. Specifically, the support 125 may have a shape along a cylinder, an elliptical cylinder, or a prism. Alternatively, the support 125 may have a shape along a circular cone shape or a pyramid shape.

The support 125 is preferably configured to be mounted on a cylindrical object. Here, examples of the cylindrical object include a column shape, a cone shape, a pyramid shape, or a cylinder whose orientation of a side surface continuously changes, and the like.

The support 125 is preferably flexible. When the support 125 has flexibility, for example, the support 125 is easily worn on or removed from an arm. When the electronic device 100 is worn on or removed from an arm, it is preferable that regions with a large radius of curvature in the cross section of the support 125 not be substantially deformed and end portions of the support 125 be bendable.

The housing 126 may be flexible, for example. When the housing 126 is flexible, the display portion 102 may be bent in the C-D direction shown in FIG. 1D. The display portion 102 is preferably bendable because breakdown of the display portion 102 may hardly occur when the electronic device 100 is worn or removed.

Examples of the housing 126 include glass, quartz, plastic, a flexible board, an attachment film including a resin, paper including a fibrous material, and a base film. Examples of glass include barium borosilicate glass, aluminoborosilicate glass, and soda lime glass. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and the like. Alternatively, a board including metal, stainless steel, or stainless steel foil, a board including tungsten or tungsten foil, paper, a semiconductor (such as a single crystal semiconductor or a silicon semiconductor), or the like may be used.

For a material which can be used for the support 125, description of the material that can be used for the housing 126 can be referred to.

Figure 2A:
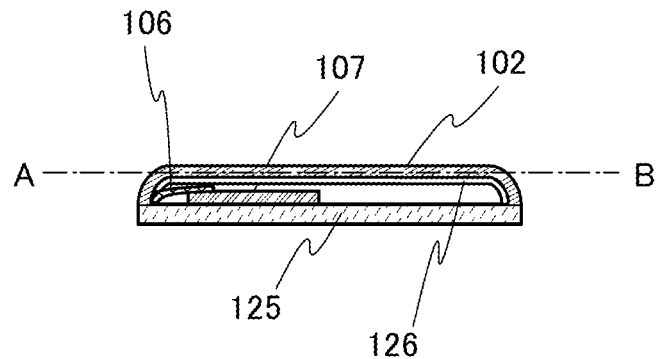
FIGS. 2A to 2C are cross-sectional views each illustrating an electronic device of one embodiment of the present invention.
Figure 2B:
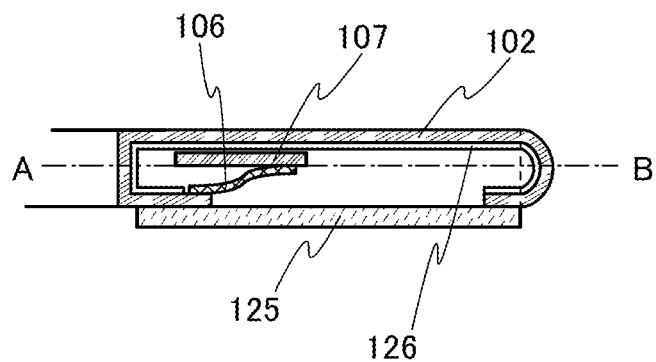
Figure 2C:
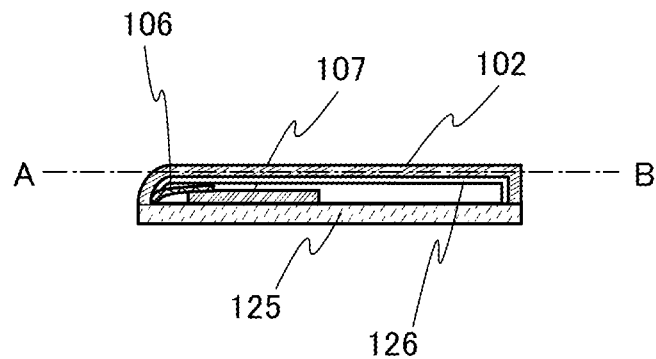

FIGS. 2A to 2C show variations of the cross section in FIG. 1C. In FIG. 1C, the side surface of the display portion has a semicircular cross section, while in FIG. 2A, the side surface of the display portion has a quarter-circle-shaped cross section. As shown in FIGS. 2B and 2C, one of the side surfaces of the display portion may be a flat surface, and the other may be a curved surface. In FIG. 2B, the curved side surface has a semicircular cross section, while in FIG. 2C, the curved side surface has a quarter-circle-shaped cross section.

Figure 3A:
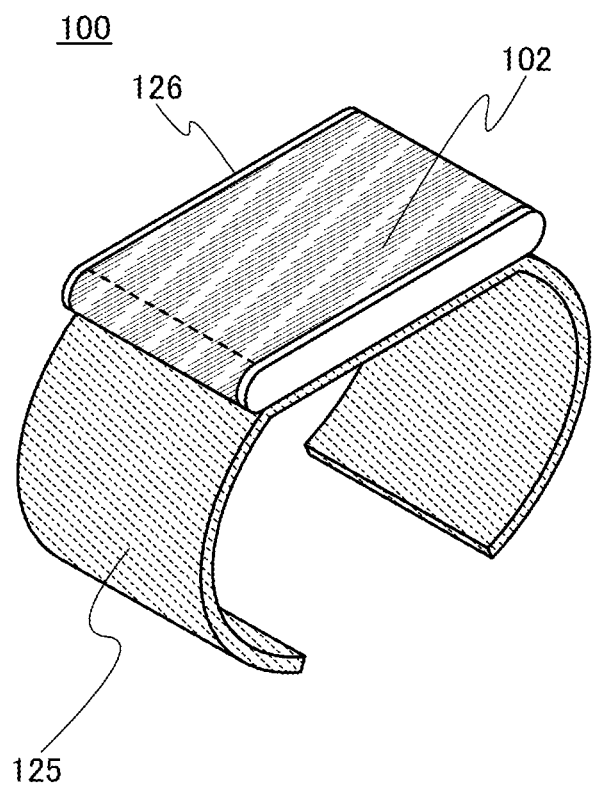
FIG. 3A to 3D are a perspective view, a top view, and cross-sectional views illustrating an electronic device of one embodiment of the present invention.
Figure 3B:
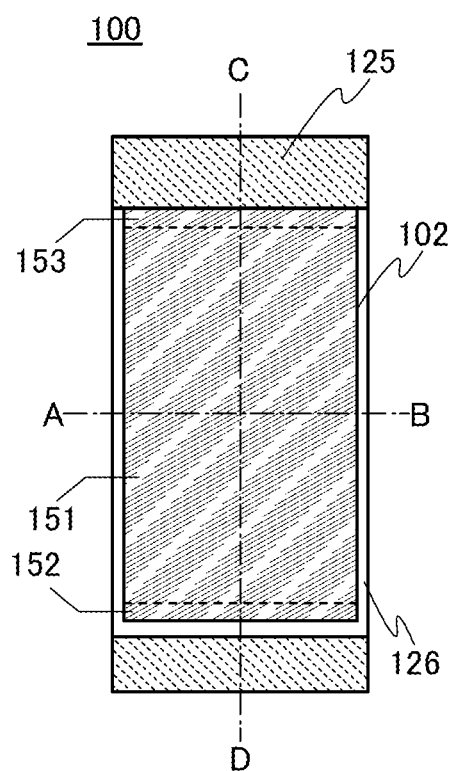
Figure 3C:
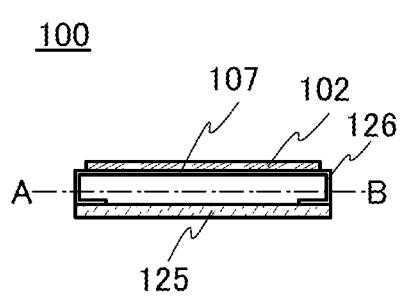
Figure 3D:
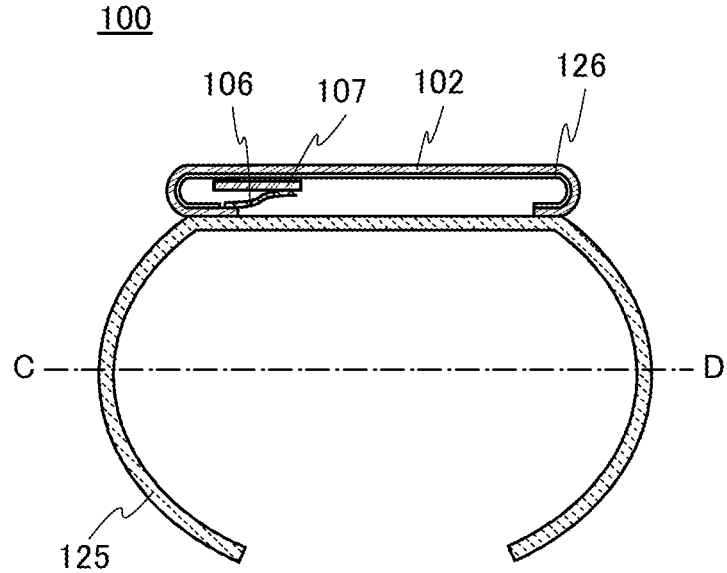

FIG. 3A is a perspective view of the electronic device 100. FIG. 3B is a top view of the electronic device 100. FIGS. 3C and 3D show cross sections taken along the dashed-dotted lines A-B and C-D in FIG. 3B, respectively. The electronic device 100 in FIG. 3A includes the display portion 102, the housing 126, and the support 125. The display portion 102 has a curved first side surface. The electronic device 100 may have a curved second side surface that substantially faces the first side surface. In FIG. 3A, the orientation of the display portion when seen from the top surface differs by 90 degrees from that of the electronic device 100 in FIG. 1A. In FIG. 3D, for example, the first side surface and the second side surface each have a plane that is substantially perpendicular to the dashed-dotted line C-D.

As shown in FIG. 1A and FIG. 3A, the display portion 102 has, for example, the top surface in the form of an approximately quadrangle, and the first side surface and the second side surface which are in contact with two facing sides of the top surface.

Here, the top surface, the first side surface, and the second side surface are denoted by a display region 151, a display region 152, and a display region 153, respectively. A plurality of display regions are preferably provided.

The display region 152 may be provided over the first side surface and two planes of the top surface and the rear surface of the display portion 102 which are adjacent to the first side surface. Furthermore, the display region 153 may be provided over the second side surface and two planes of the top surface and the rear surface of the display portion 102 which are adjacent to the second side surface.

With such a structure, display can be performed not only on the top surface of the display portion 102, as in conventional electronic devices, but also on a side surface of the display portion 102. In particular, a display region is preferably provided along two or more side surfaces of the display portion 102 because the variety of display is further increased.

The display region 151 provided on the top surface of the display portion 102 and the display regions provided along the side surfaces of the display portion 102 may be independently used as display regions to display different images or the like, or two or more of the display regions may display one image or the like. For example, a continuous image may be displayed on the display region 151 provided on the top surface of the display portion 102, the display region 152 provided along the side surface of the display portion 102, or the like.

In the display portion 102 of the electronic device 100, the display regions are provided on the curved first and second side surfaces, so that the surface area of the display regions of the display portion 102 can be increased compared to the case where the display region is provided only on the top surface of the display portion 102. Here, for example, as shown in FIG. 1B, a width 201 of the display regions of the display portion 102 is preferably larger than a width 202 of the support 125. Furthermore, in FIG. 1B, the width of the top surface of the display portion 102 is almost equal to the width of the support 125. Much more information can be displayed by an increase in the surface area in such a manner. Furthermore, because the display region provided on the first side surface can be seen from a wide range, visibility is improved.

Figures 1, 4A:
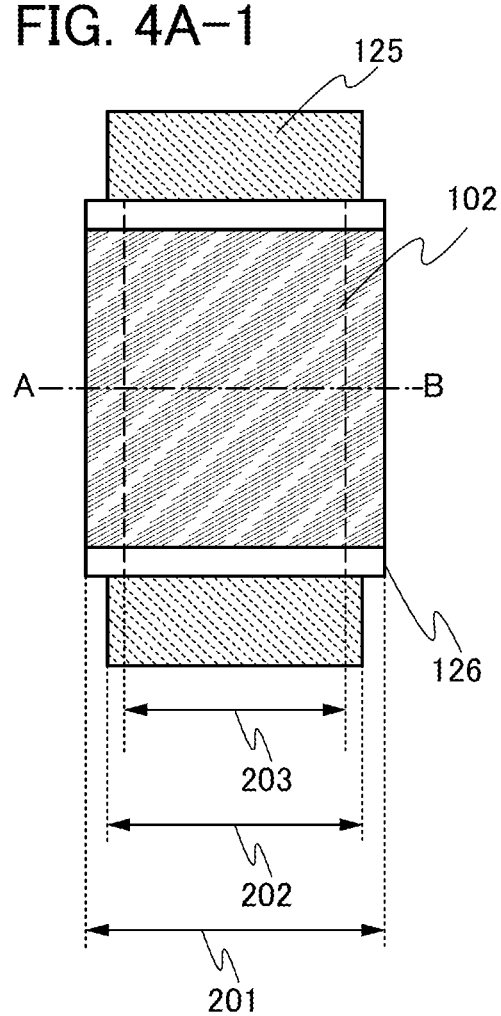
FIGS. 4A-1, 4A-2, 4B-1, and 4B-2 are top views and cross-sectional views illustrating electronic devices of one embodiment of the present invention.
Figures 2, 4A:
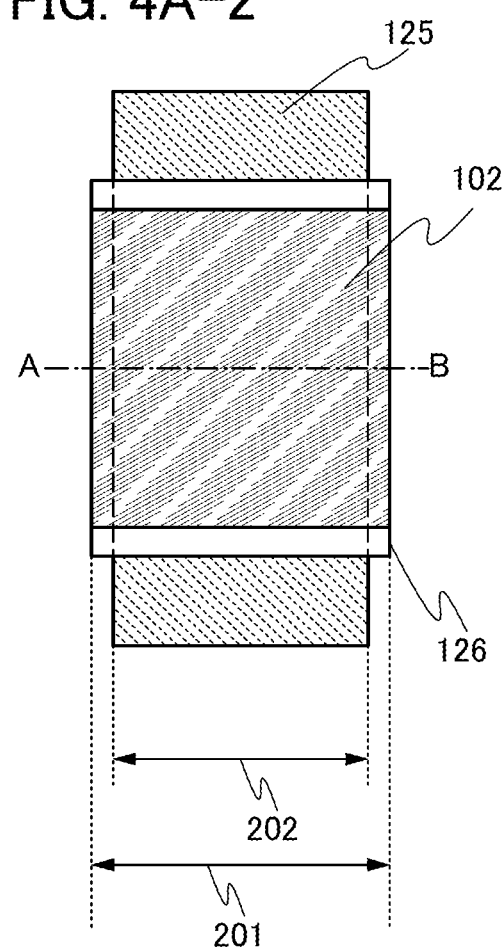
Figures 1, 4B:
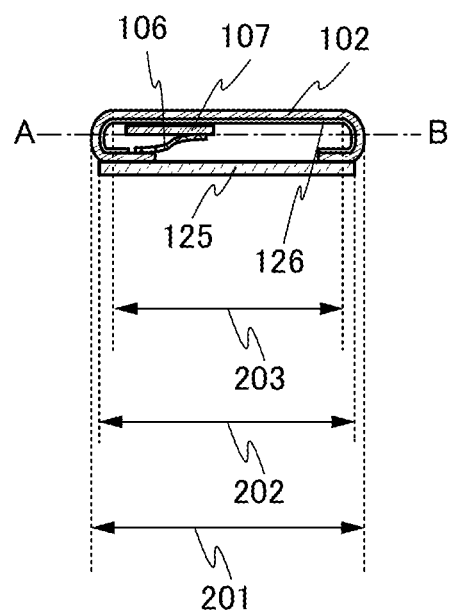
Figures 2, 4B:
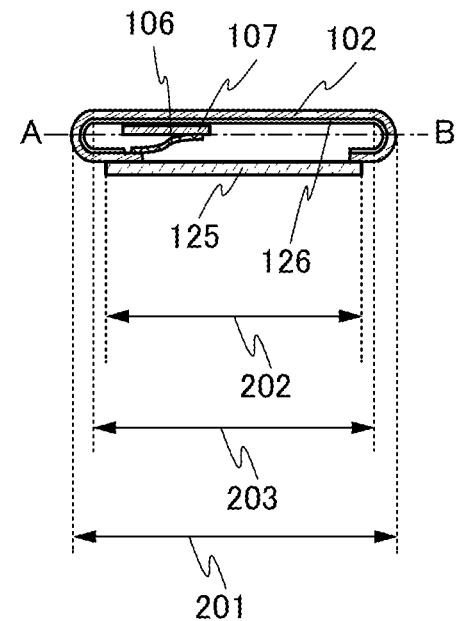

Variations of the structure in FIGS. 1B and 1C are shown in FIGS. 4A-1 and 4B-1. In FIGS. 4A-1 and 4B-1, the width 201 of the display portion 102 is larger than the width 202 of the support 125. Furthermore, a width 203 of the top surface of the display portion 102 is smaller than the width 202 of the support 125.

Other variations of the structure in FIGS. 1B and 1C are shown in FIGS. 4A-2 and 4B-2. In FIGS. 4A-2 and 4B-2, the width 201 of the display portion 102 is larger than the width 202 of the support 125. The width 203 of the top surface of the display portion 102 is larger than the width 202 of the support 125. Here, when the width 203 of the top surface of the display portion 102 is larger than the width of the support 125, the display portion 102 may be easily brought into contact with part of an arm when the electronic device 100 is worn on the arm, for example. Even in such a case, because the side surfaces of the display portion 102 are curved and round, the electronic device 100 can fit a body more snugly.

Figure 5A:
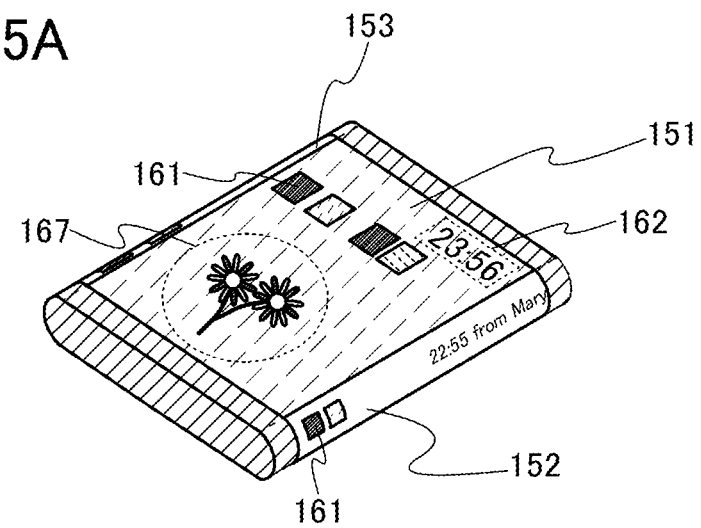
FIGS. 5A and 5B are perspective views each illustrating an electronic device of one embodiment of the present invention.
Figure 5B:
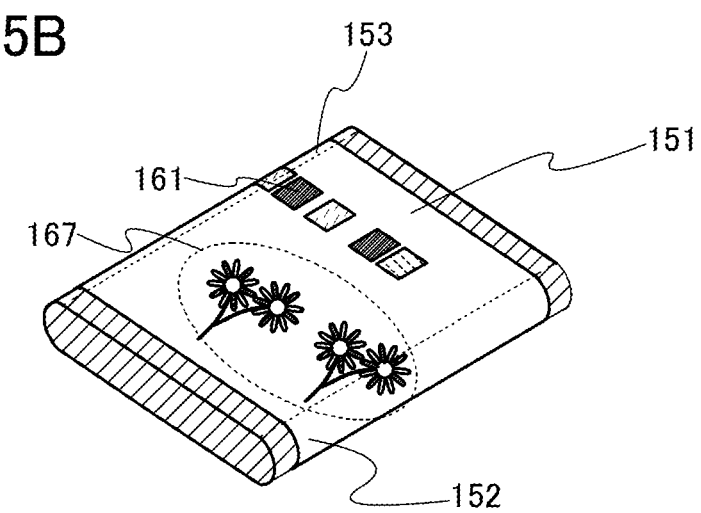

FIGS. 5A and 5B show examples of use states of the display portion 102 included in the electronic device 100 in FIGS. 1A to 1D and FIGS. 2A to 2C. In FIG. 5A, on the display region 151 provided on the top surface of the display portion 102, image data 167, text data 162, a plurality of icons 161 associated with an application or the like, and the like are displayed. The icons 161 associated with an application or the like, and the like are displayed on the display region 152 provided on the side surface of the display portion 102. It is preferable that a button for power-on or -off of the electronic device 100, a button for a lock or a start of the screen, and the like be provided in the display region 152. These buttons are preferably touch-sensor buttons. By the use of the touch-sensor buttons, the area occupied by the buttons and a peripheral portion connected to the buttons can be made smaller compared to the case where a mechanical button that is physically provided is provided. Thus, the electronic device 100 can be made thinner, which is preferable. By thinning the electronic device 100, the electronic device 100 can fit a body such as an arm more snugly. Note that the electronic device 100 may have both touch-sensor buttons and mechanical buttons.

In addition, transmitter information (e.g., a name, a phone number, an e-mail address, and the like of a transmitter) may be displayed on not only the display region 151 but also a display region provided along the side surface such as the display region 152, and the like when, for example, a phone call or a text message is received. FIG. 5A shows an example of the case where transmitter information is displayed to roll across the display region 152 when an e-mail is received.

As shown in FIG. 5B, the image data 167, the icons 161, and the like may be continuously displayed on the display regions 151 to 153. The continuous display on the display regions 151 to 153 enables the display regions to display a larger image. Thus, compared with the case where the image data 167 and the like are displayed only on the display region 151, the display regions can be seen from a wide angle; thus, visibility can be improved. Furthermore, more powerful image data can be displayed.

Figure 6A:
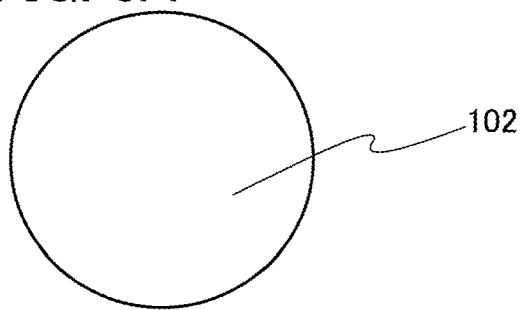
FIGS. 6A to 6F are a top view and perspective views illustrating electronic devices of one embodiment of the present invention.
Figure 6B:
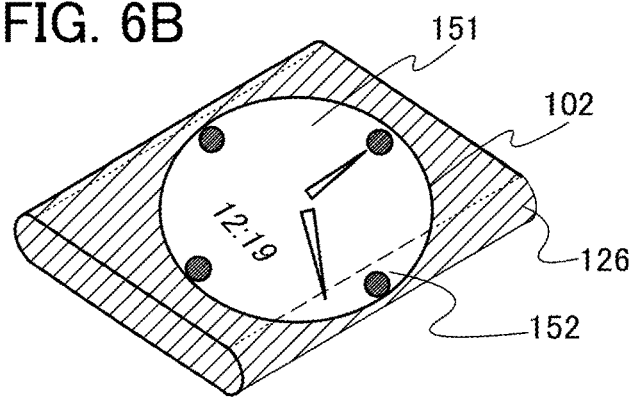
Figure 6C:
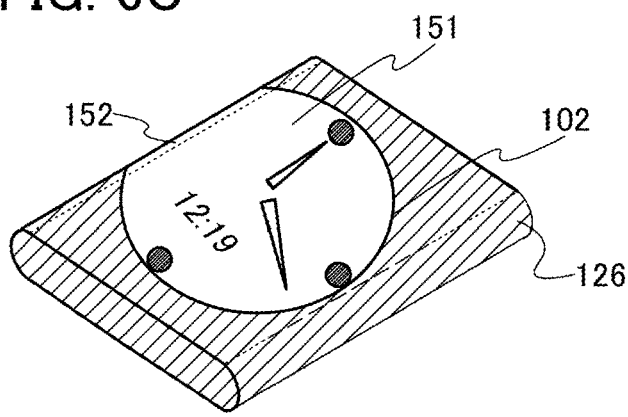
Figure 6D:
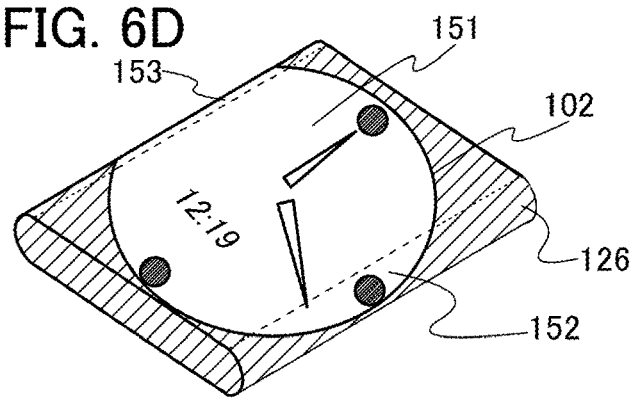
Figure 6E:
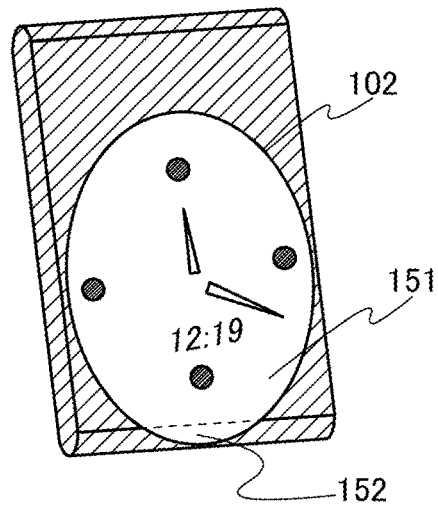
Figure 6F:
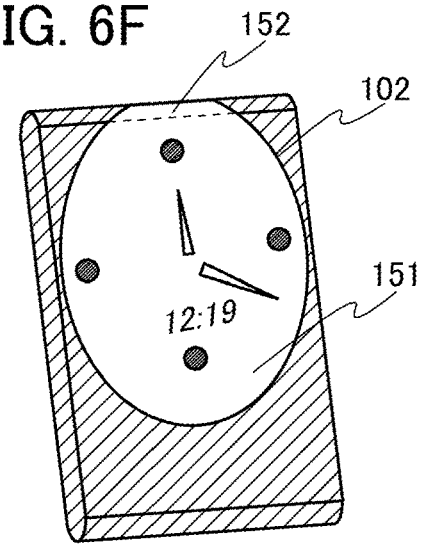

The display region of the display portion 102 may be circular or elliptical. FIG. 6A shows a top view of the display portion 102 before being placed in the housing 126. FIGS. 6B to 6F are electronic devices 100 each provided with the display portion 102 having a circular display region. FIG. 6D shows an example in which the circular display region includes three display regions (the display regions 151, 152, and 153), and FIGS. 6B, 6C, 6E, and 6F each show an example in which the circular display region includes two display regions (the display regions 151 and 152). The display regions 152 and 153 have curved surfaces. FIG. 6B shows an example in which the display regions are formed on a top surface and a curved side surface in contact with a right side of the top surface. FIG. 6C shows an example in which the display regions are formed on a top surface and a curved side surface in contact with a left side of the top surface. FIG. 6D shows an example in which the display regions are formed on a top surface and curved side surfaces in contact with left and right sides of the top surface. FIG. 6E shows an example in which the display regions are formed on a top surface and a curved side surface in contact with a lower side of the top surface. FIG. 6F shows an example in which the display regions are formed on a top surface and a curved side surface in contact with an upper side of the top surface.

During a standby time during which the electronic device is not used, display on the display region 151 provided along the top surface of the display portion 102 may be turned off (e.g., black display) and data may be displayed only on the display region 152 or the like provided along the side surface. Display on the display region 151 which has an area larger than those of the other display regions is not performed, so that power consumption in a standby time can be reduced.

Note that the display region 153 is not necessarily provided in the electronic device 100.

Figure 7A:
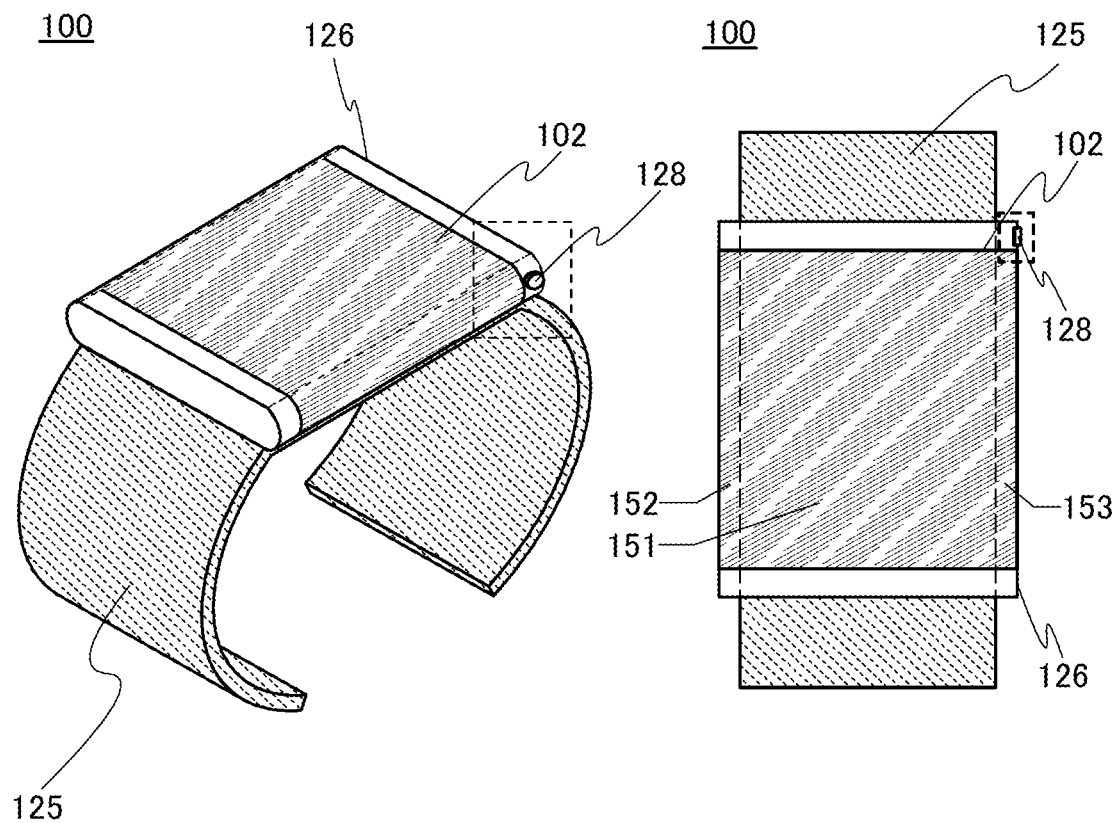
FIGS. 7A to 7D are perspective views and top views illustrating an electronic device of one embodiment of the present invention.
Figure 7B:
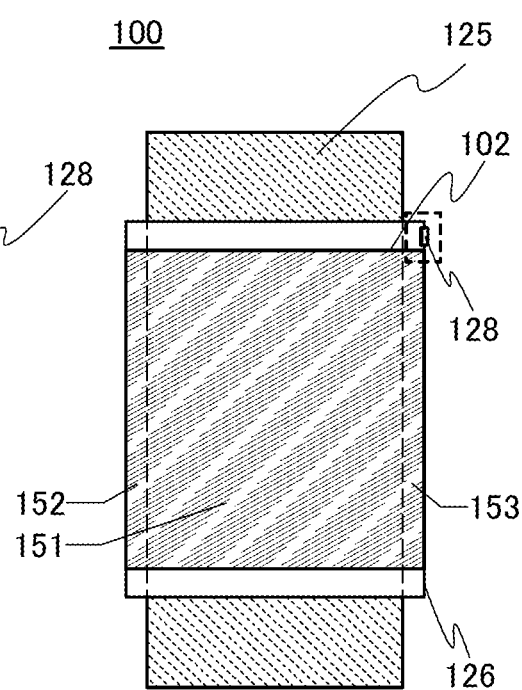
Figure 7C:
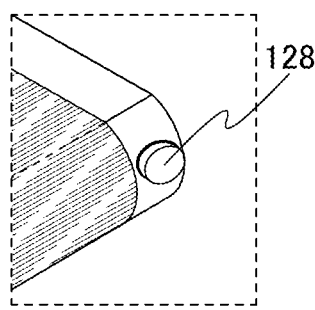
Figure 7D:
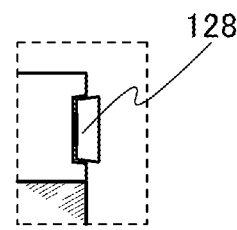

The electronic device 100 may have a button. FIG. 7A shows an example in which the electronic device 100 in FIG. 1A has a button 128. FIG. 7B shows a top view of the electronic device 100 in FIG. 7A. FIGS. 7C and 7D show enlarged views of regions surrounded by the dashed lines in FIGS. 7A and 7B, respectively. The button 128 shown in FIGS. 7A to 7D is an example of a button called a push-button; however, the shape and the function of the button are not limited to this example.

Figure 8A:
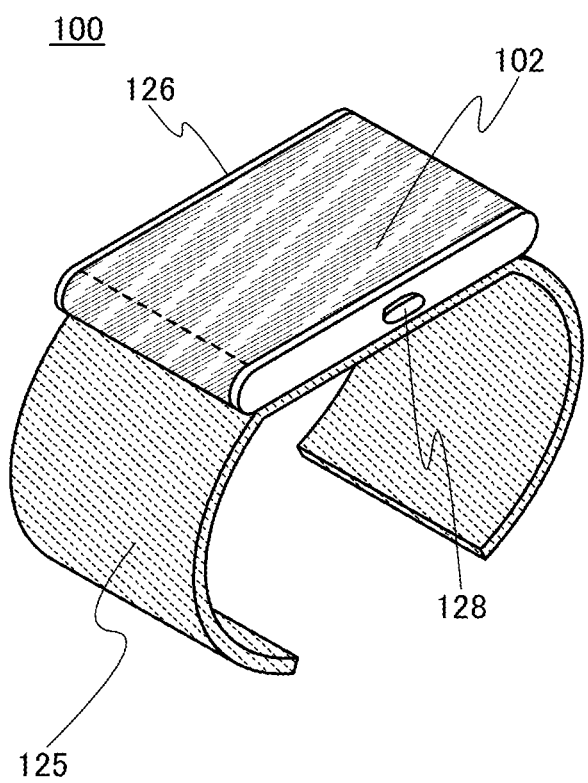
FIGS. 8A and 8B are a perspective view and a top view illustrating an electronic device of one embodiment of the present invention.
Figure 8B:
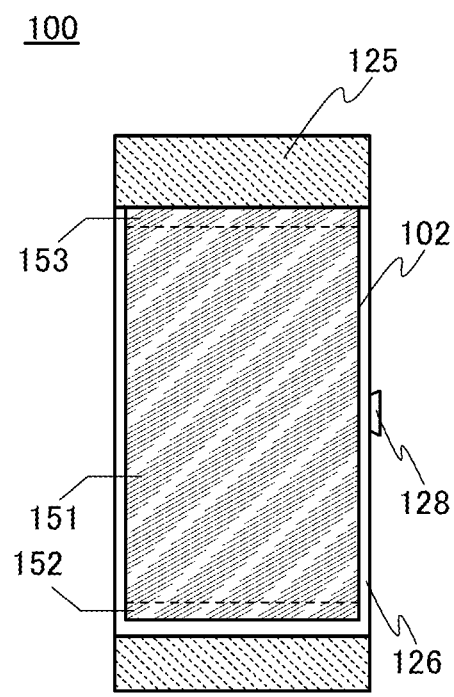

FIG. 8A shows an example in which the electronic device 100 in FIG. 2A has the button 128. FIG. 8B shows a top view of the electronic device 100 in FIG. 8A. As shown in FIGS. 8A and 8B, the electronic device may have the button 128 on its side surface. As the button 128, the mechanical button described above may be used, for example.

Figure 9:
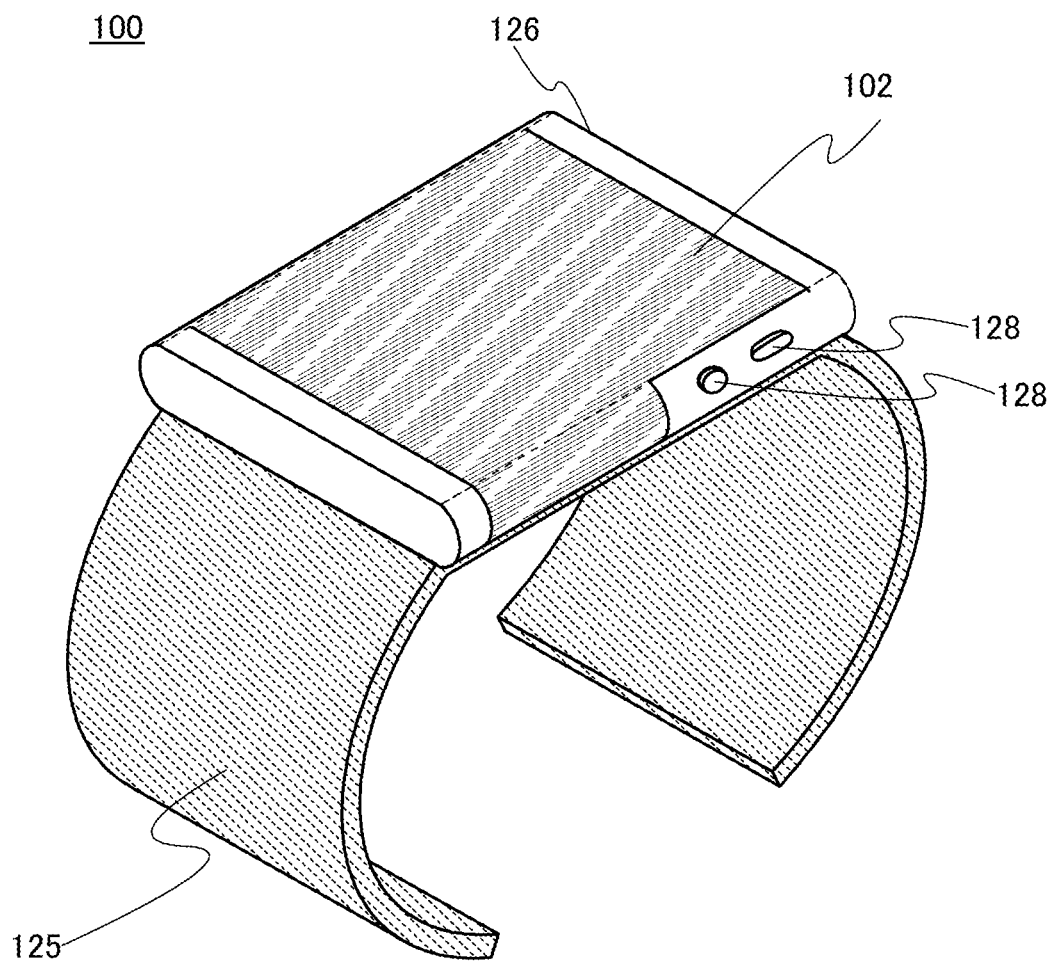
FIG. 9 is a perspective view illustrating an electronic device of one embodiment of the present invention.

FIG. 9 shows a variation of the electronic device 100 in FIG. 2A. FIG. 9 shows an example in which an indentation is provided in part of the curved first side surface, here, at an upper half part, and the buttons 128 are provided in that part.

Figure 10A:
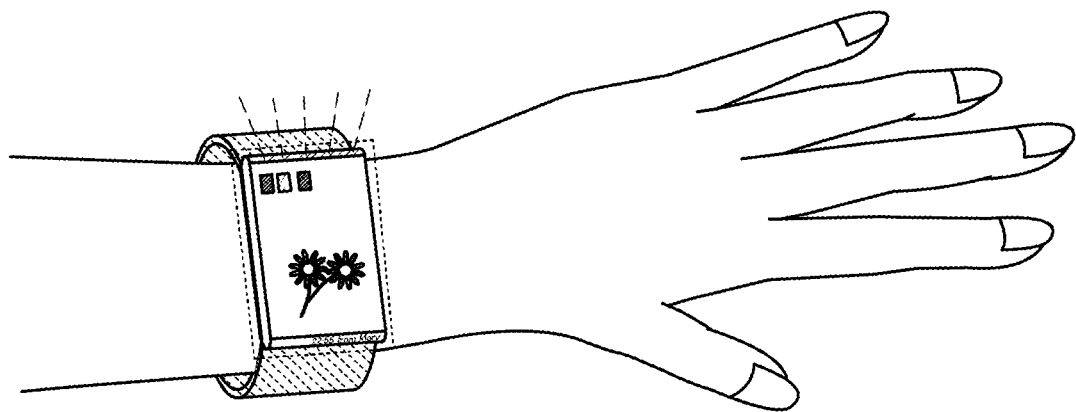
FIGS. 10A and 10B illustrate one embodiment of the present invention.
Figure 10B:
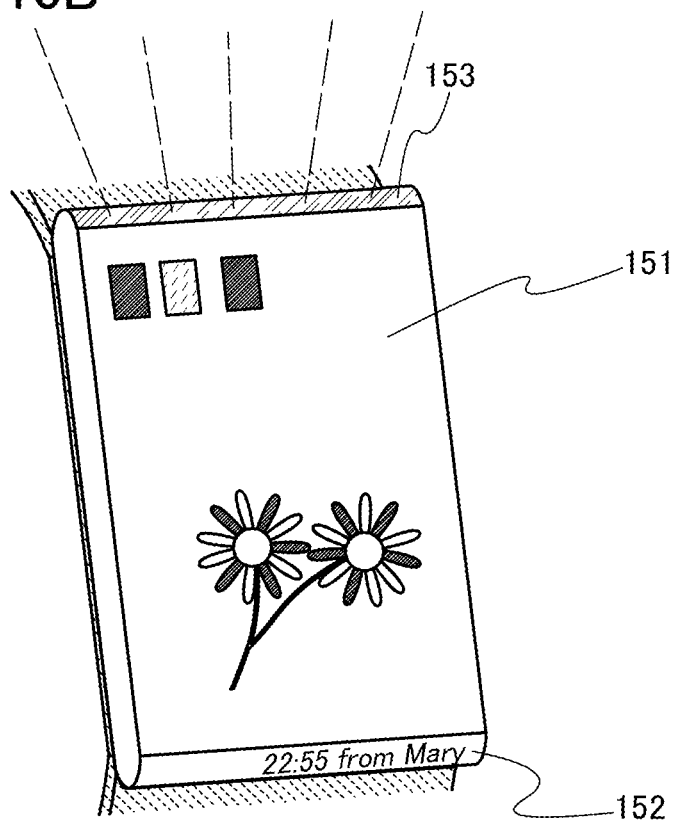

In the example of FIG. 10A, the electronic device 100 is worn on an arm. FIG. 10B is an enlarged view of a region of the electronic device 100 that is surrounded by the dashed line in FIG. 10A.

For example, display of transmitter information on the display region 152 at e-mail reception as described above is easily viewed.

Furthermore, for example, the display region 153 may be used as lighting as shown in FIG. 10B.

FIGS. 1A to 1D and FIGS. 3A to 3D show examples in each of which at least part of the display portion 102 included in the electronic device 100 is in contact with an outer surface of the housing 126. However, as shown in FIGS. 11A to 11D, the display portion 102 may be provided inside the housing 126. In the case where the display portion 102 is provided inside the housing 126, the housing 126 preferably has a light-transmitting property.

Figure 11A:
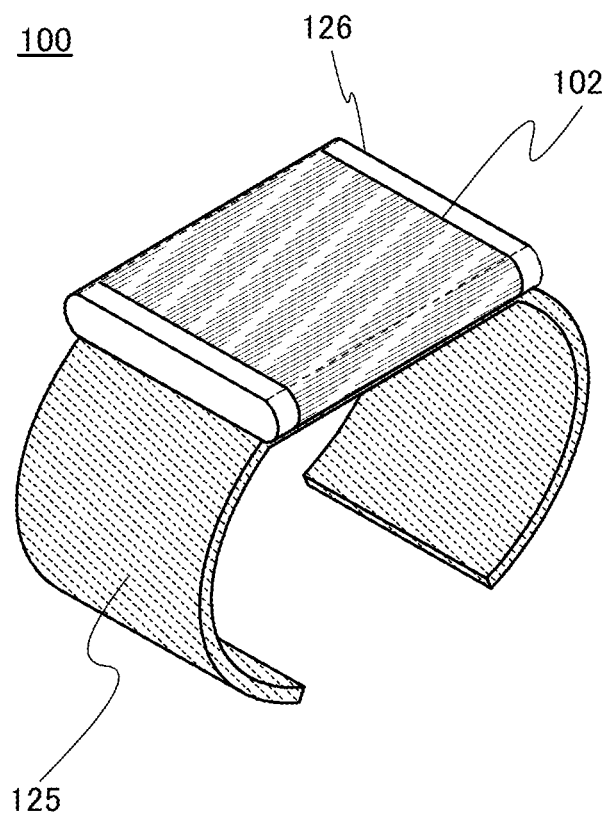
FIGS. 11A to 11D are a perspective view, a top view, and cross-sectional views illustrating an electronic device of one embodiment of the present invention.
Figure 11B:
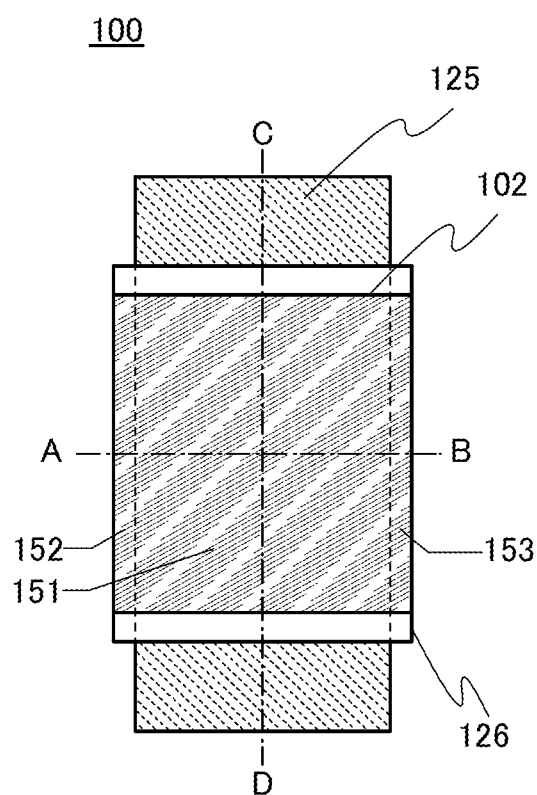
Figure 11C:
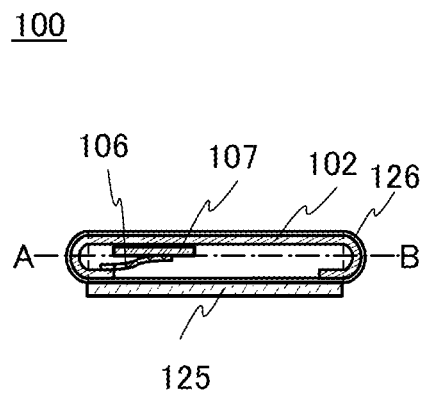
Figure 11D:
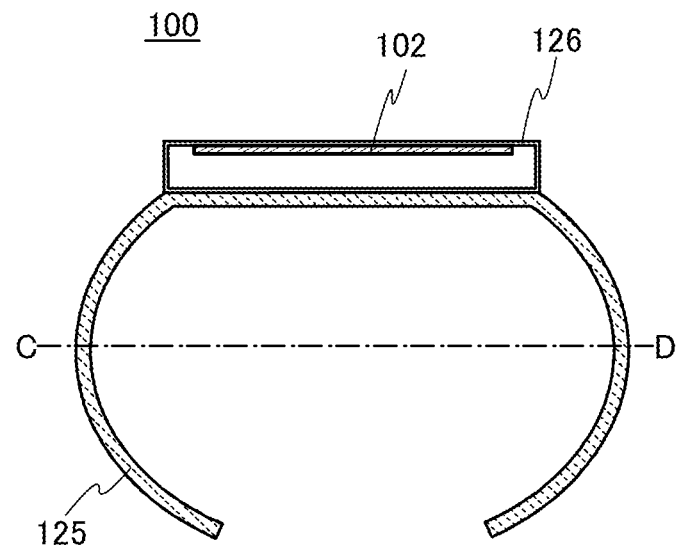

FIG. 11A is a perspective view of the electronic device 100. FIG. 11B is a top view of the electronic device 100. FIGS. 11C and 11D show cross sections taken along the dashed-dotted lines A-B and C-D in FIG. 11B, respectively. The electronic device 100 includes the display portion 102, the housing 126, the circuit board 106, and the circuit board 107. The display portion 102 has the curved first side surface. The electronic device 100 may have the curved second side surface that substantially faces the first side surface. As shown in FIGS. 11C and 11D, at least part of the display portion 102 is placed inside the housing 126. Furthermore, the circuit board 106 and the circuit board 107 are preferably provided inside the housing 126. Furthermore, it is preferable that the circuit board 106 be electrically connected to the display portion 102.

The display portion 102 is provided inside the housing 126; thus, the strength of the structure can be increased. Furthermore, in some cases, the electronic device 100 is not easily broken even when the display portion 102 collides with an object due to falling or collision.

Figure 12A:
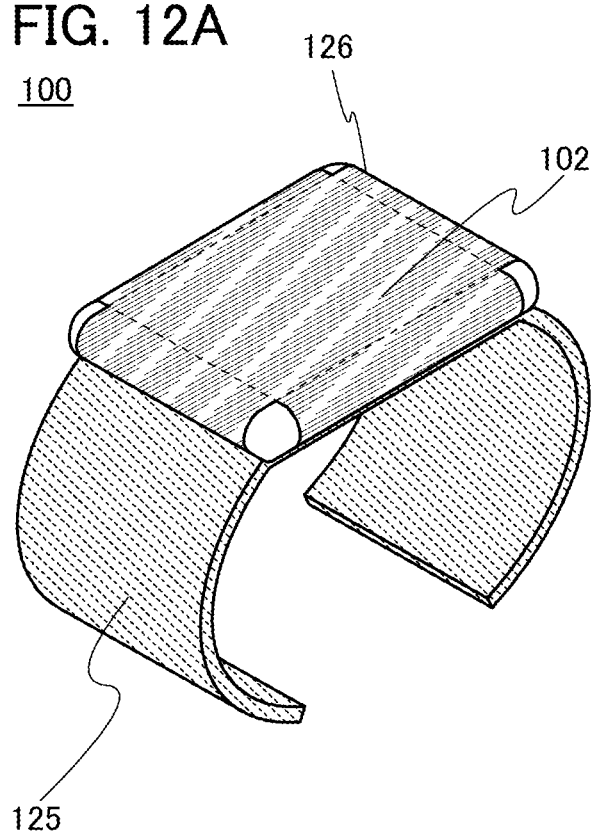
FIGS. 12A to 12D are a perspective view, a top view, and cross-sectional views illustrating an electronic device of one embodiment of the present invention.
Figure 12B:
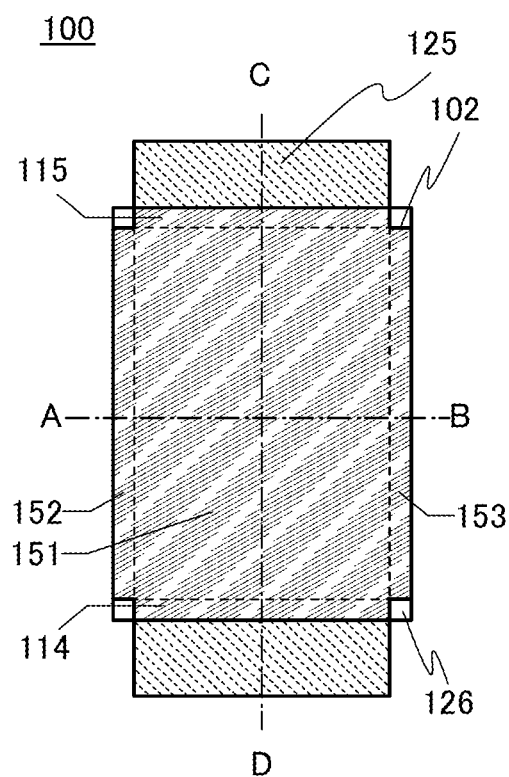
Figure 12C:
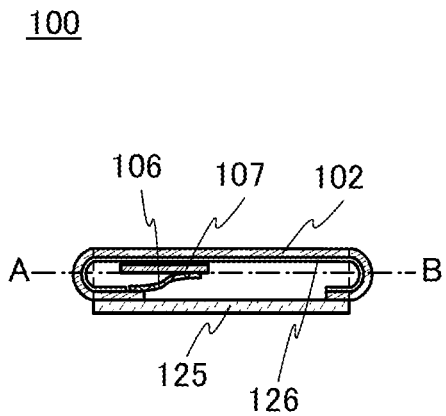
Figure 12D:
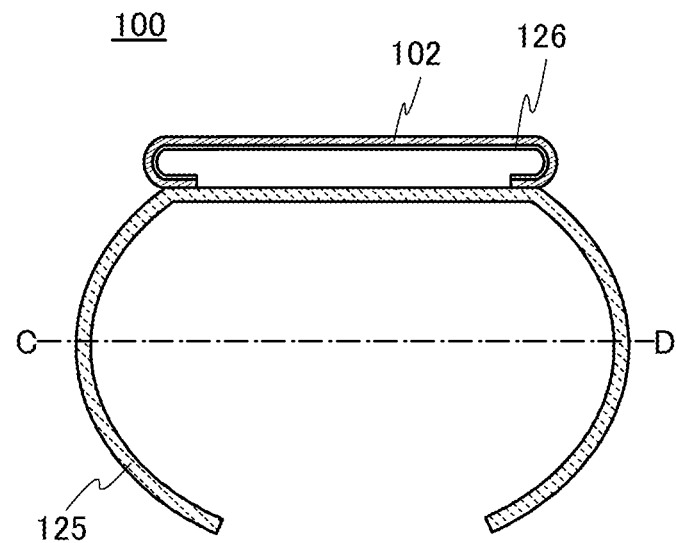

FIG. 12A is a perspective view of the electronic device 100. FIG. 12B is a top view of the electronic device 100. FIGS. 12C and 12D are cross sections taken along the dashed-dotted lines A-B and C-D in FIG. 12B, respectively. In FIG. 12A, the display portion 102 has a top surface that is substantially quadrangular, and first to fourth side surfaces in contact with four sides of the top surface. The first to fourth side surfaces have curved surfaces. The first and second side surfaces each may have a plane that is substantially perpendicular to the dashed-dotted line A-B as shown in FIG. 12C, and the third and fourth side surfaces each may have a plane that is substantially perpendicular to the dashed-dotted line C-D as shown in FIG. 12D. Provision of the display regions for the top surface and the first to fourth side surfaces is preferable because the variety of display is further increased.

Display can be performed so that the text data 164 or the like rolls (moves) across a plurality of display regions of the electronic device 100. By performing display across two or more surfaces of the display portion 102 in this manner, a user can be prevented from missing displayed data regardless of the direction of the electronic device when, for example, a phone call is received.

Figure 13A:
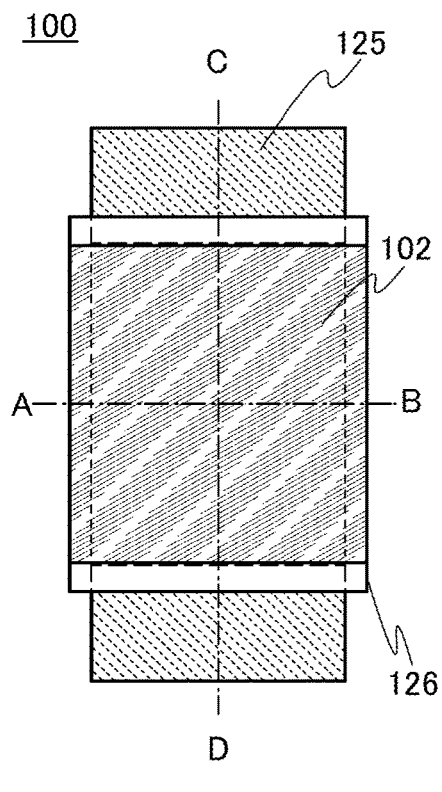
FIGS. 13A to 13F are top views and cross-sectional views illustrating electronic devices of one embodiment of the present invention.
Figure 13B:
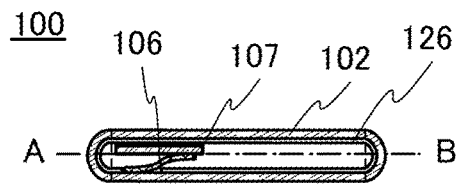
Figure 13C:
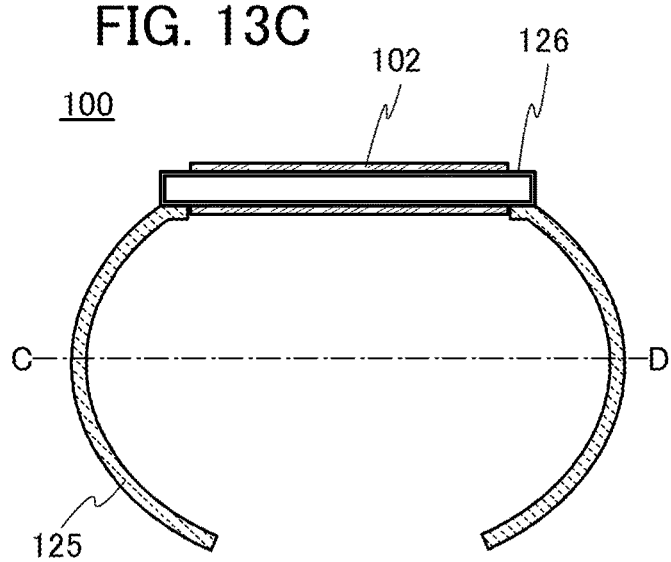
Figure 13D:
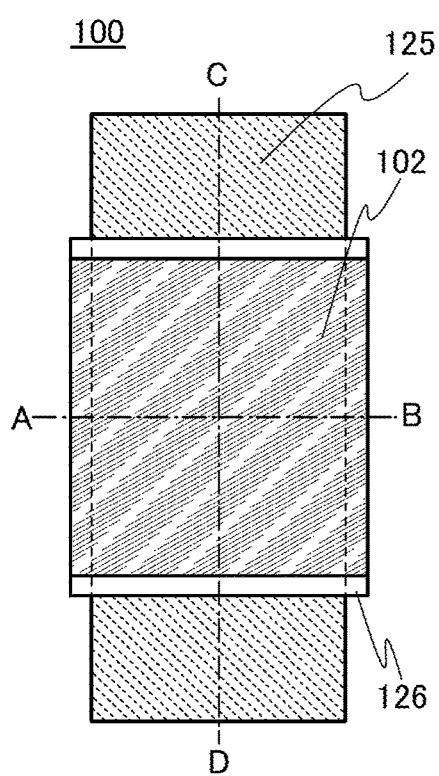
Figure 13E:
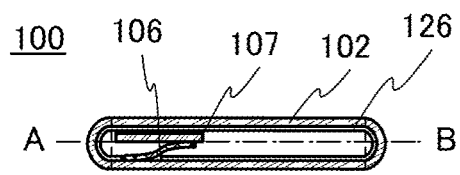
Figure 13F:
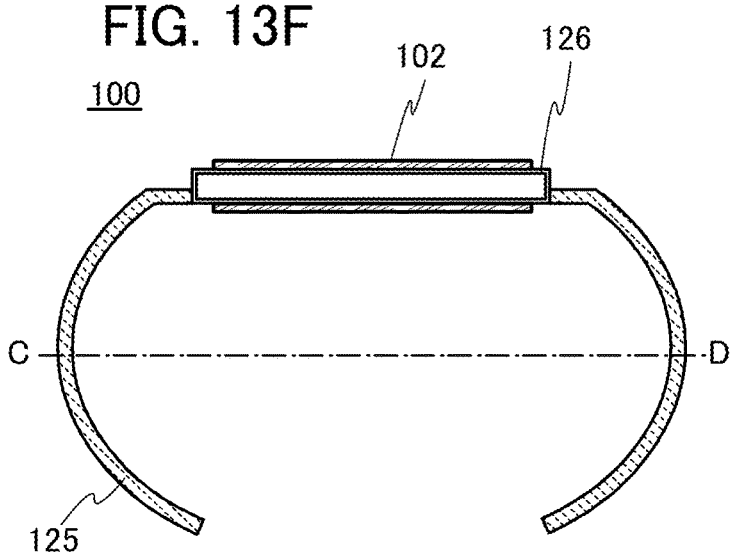

Here, as in examples illustrated in FIGS. 13A to 13F, the electronic device 100 may have a structure in which the support 125 has two structure bodies which are one pair, and the two structure bodies are placed to face each other with the housing 126 provided therebetween. FIG. 13A is a top view of the electronic device 100. FIGS. 13B and 13C show cross sections taken along the dashed-dotted lines A-B and C-D in FIG. 13A, respectively. FIG. 13D is a top view of the electronic device 100. FIGS. 13E and 13F show cross sections taken along the dashed-dotted lines A-B and C-D in FIG. 13D, respectively. FIGS. 13A to 13C show an example in which the support 125 is provided in contact with a lower surface of the housing 126. FIGS. 13D to 13F show an example in which the support 125 is provided in contact with side surfaces of the housing 126.

Figure 14A:
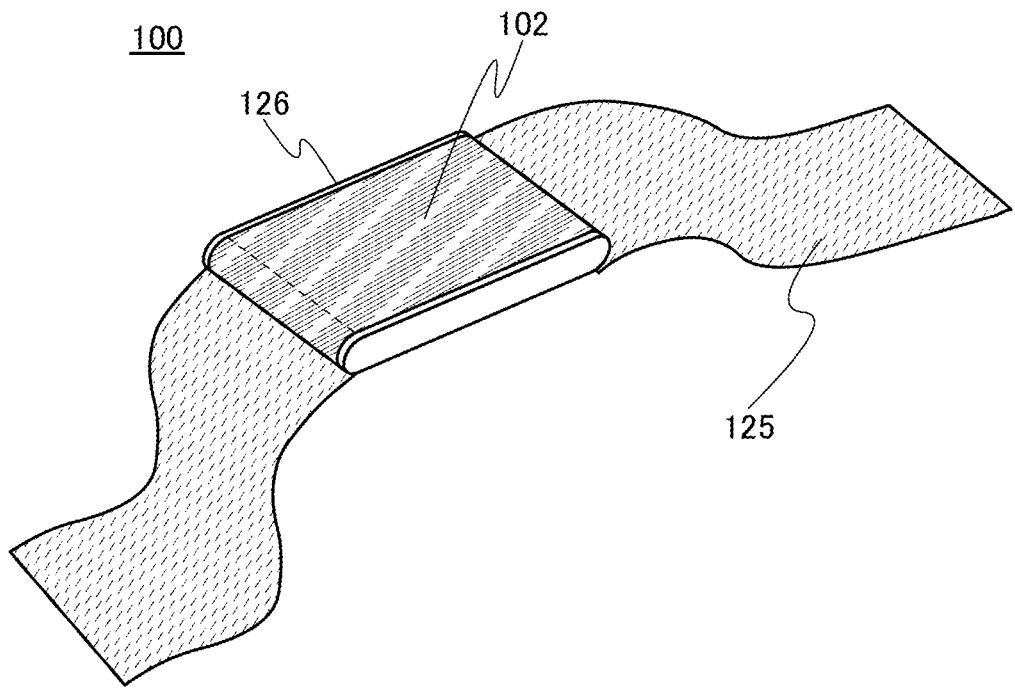
FIGS. 14A and 14B are perspective views each illustrating an electronic device of one embodiment of the present invention.
Figure 14B:
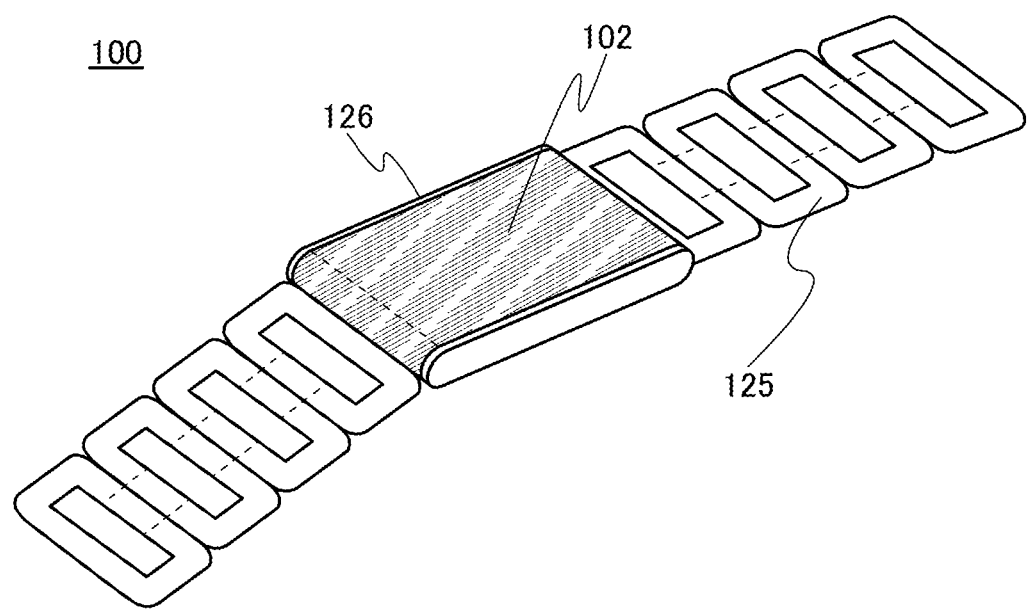

Here, the support 125 included in the electronic device 100 may have a belt shape, for example. Further, as in an example of a perspective view in FIG. 14A, the belt-shaped support 125 may have high flexibility. For example, the support 125 preferably has higher flexibility than the housing 126. Higher flexibility of the support 125 allows the space between the support 125 and an arm to be reduced in the case where the electronic device 100 is worn on the arm, for example, and thus, the electronic device 100 can fit a body more snugly. Furthermore, as shown in the perspective view in FIG. 14B, the support 125 may have a chain shape. With the chain shape, the electronic device 100 is easily deformed and thus can fit a body more snugly.

Figure 15A:
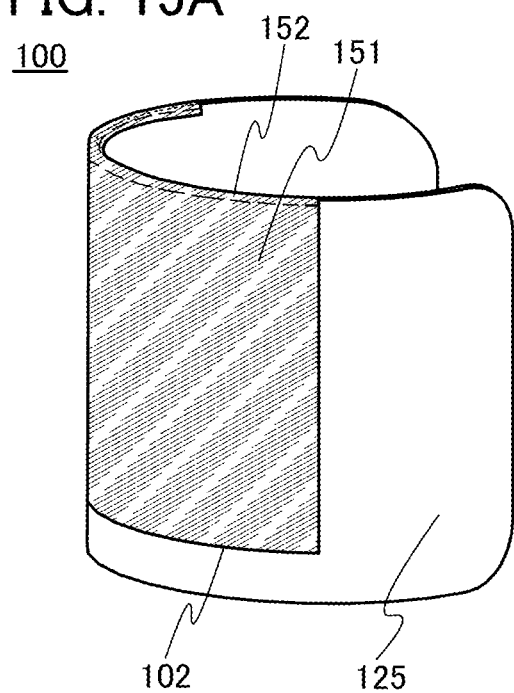
FIGS. 15A to 15D are a perspective view, top views, and a cross-sectional view illustrating an electronic device of one embodiment of the present invention.
Figure 15B:
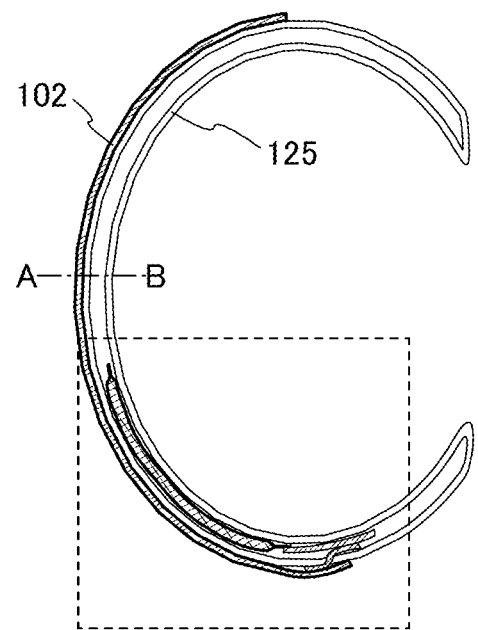
Figure 15C:
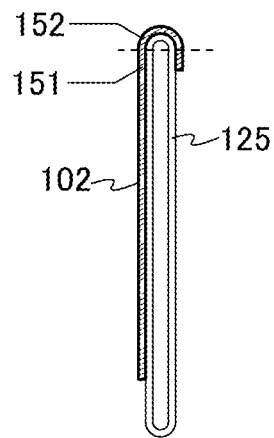
Figure 15D:
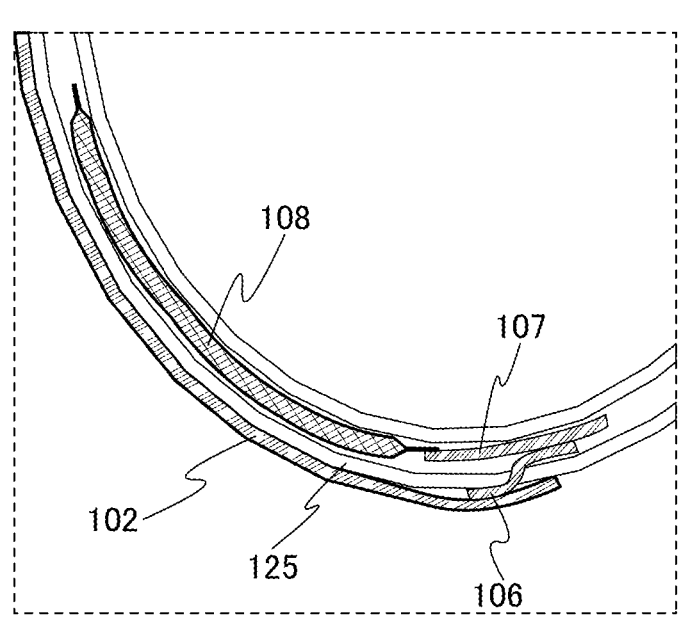

FIG. 15A shows an example of a perspective view of the electronic device 100. FIG. 15B is a top view of the electronic device 100 in FIG. 15A. FIG. 15C is a cross section taken along the dashed-dotted line A-B in FIG. 15B. FIG. 15D is an enlarged view of a region that is surrounded by the dashed line in FIG. 15B. In an example of FIG. 15B, the cross section of the electronic device 100 has an arch shape. The display portion 102 includes a display region 151 having an arch shaped cross-section and a display region 152 that is adjacent to the display region 151 and has a curved surface over the side surface to the rear surface of the display portion 102. Here, the rear surface is, for example, a surface that is positioned to face the display region 151 having the arch shaped cross-section.

Note that the display region is provided on only one side surface of the display portion 102 in FIGS. 15A to 15D; however, the display region may be formed on both side surfaces. For example, a third display region being adjacent to the display region 151 and facing the display region 152 may be provided.

As shown in FIG. 15D, the electronic device 100 preferably includes the circuit board 106 electrically connected to the display portion 102, the circuit board 107 electrically connected to the circuit board 106, and a storage battery 108 electrically connected to the circuit board 107.

As the storage battery 108, for example, a thin storage battery whose exterior body is formed using a laminate film can be used. The use of a flexible laminate film for the exterior body enables the storage battery 108 to have flexibility. As the storage battery 108, for example, a coin-type (or button-type) storage battery, a rectangular storage battery, or a cylindrical storage battery can be used. FIG. 15D shows an example in which a thin storage battery that has flexibility is used as the storage battery 108.

In the other examples of the electronic device 100 shown in FIGS. 1A to 1D, FIGS. 2A to 2C, FIGS. 3A to 3D, FIGS. 4A-1, 4A-2, 4B-1, and 4B-2, FIGS. 5A and 5B, FIGS. 6B to 6F, FIGS. 7A to 7D, FIGS. 8A and 8B, FIG. 9, FIGS. 10A and 10B, FIGS. 11A to 11D, FIGS. 12A to 12D, FIGS. 13A to 13F, and FIGS. 14A and 14B, the electronic device 100 preferably includes a storage battery. For the storage battery, the description of the storage battery 108 can be referred to. Here, the use of a thin storage battery having flexibility enables the storage battery to be placed along the curved surfaces of the display portion 102, the housing 126, and the like. The storage battery 108 has flexibility and thus can be deformed easily. After the other components such as the circuit board 106 and the circuit board 107 are placed, the storage battery 108 can be deformed in accordance with an open space and placed. Thus, the electronic device 100 can be made thin in some cases, which is preferable.

Next, an example of a method for manufacturing the electronic device 100 is described with reference to FIGS. 16A-1, 16A-2, 16A-3, 16B-1, 16B-2, and 16B-3. FIGS. 16A-1, 16A-2, and 16A-3 show a method for manufacturing the electronic device 100 having the cross section shown in FIG. 1C. FIGS. 16B-1, 16B-2, and 16B-3 show a method for manufacturing the electronic device 100 having the cross section shown in FIG. 1D.

Figures 1, 16A:
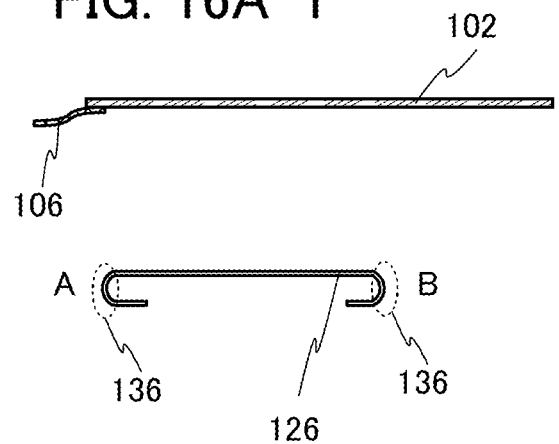
Figures 1, 16B:
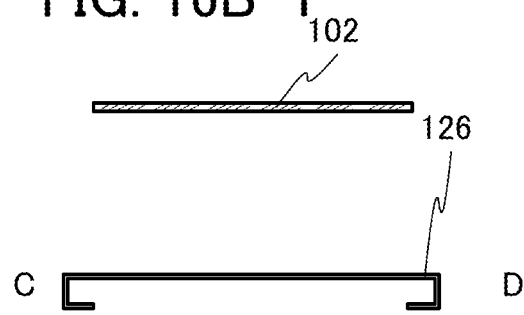
Figures 2, 16A:
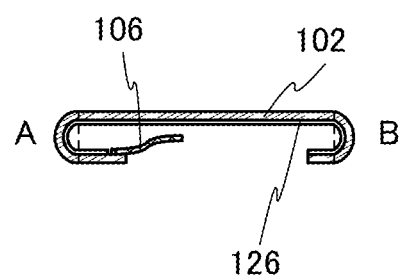
Figures 2, 16B:
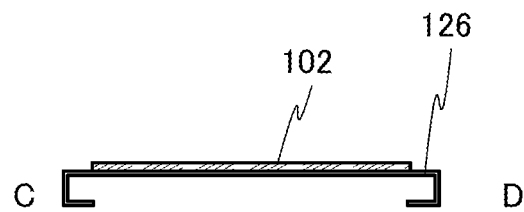
Figures 3, 16A:
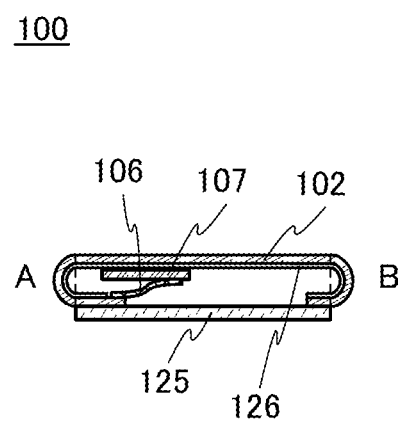
Figures 3, 16B:
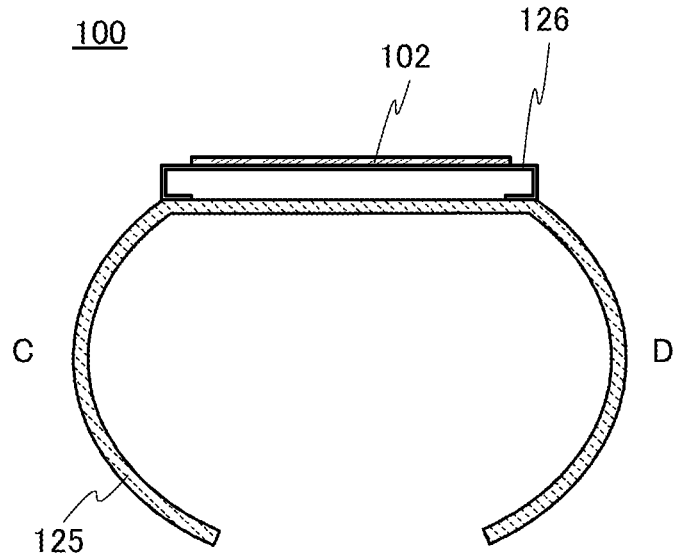

First, as shown in FIGS. 16A-1 and 16B-1, the display portion 102 and the housing 126 are prepared. Here, an example is illustrated in which the housing 126 has an opening; however, the housing 126 does not necessarily have the opening. The housing 126 has roundness 136 in the cross section shown in FIG. 16A-1. The circuit board 106 is connected to the display portion 102. The display portion 102 has flexibility. A method for manufacturing the flexible display portion 102 is described later.

Next, as shown in FIGS. 16A-2 and 16B-2, the display portion 102 is provided so as to be wrapped around the outer surface of the housing 126 along the A-B direction. Here, for example, a bonding layer may be provided between the housing 126 and the display portion 102 so that the display portion 102 is bonded to the outer surface of the housing 126. The display portion 102 is provided so as to be in contact with the outer surface of the housing 126 having the roundness 136, so that the display portion 102 that has curved side surfaces can be formed.

Next, the display portion 102 provided on the outer surface of the housing 126 is provided over the support 125 having a curved surface. Here, for example, a bonding layer may be provided between the display portion 102 and the support 125 so that the display portion 102 and the support 125 are bonded to each other.

Through the above steps, the electronic devices 100 shown in FIGS. 1A to 1D, FIGS. 2A to 2C, FIGS. 3A to 3D, FIGS. 4A-1, 4A-2, 4B-1, and 4B-2, FIGS. 5A and 5B, FIGS. 6B to 6F, FIGS. 7A to 7D, FIGS. 8A and 8B, FIG. 9, FIGS. 10A and 10B, FIGS. 11A to 11D, FIGS. 12A to 12D, FIGS. 13A to 13F, FIGS. 14A and 14B, and FIGS. 15A to 15D can be manufactured.

Figure 17A:
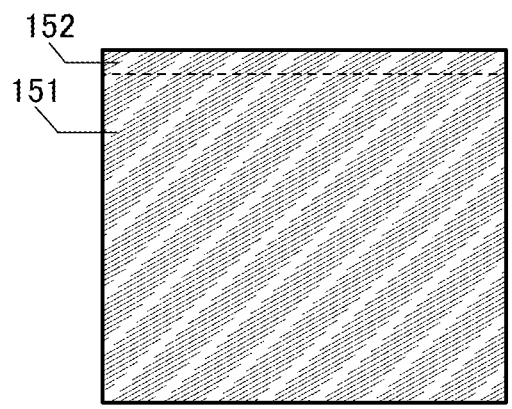
FIGS. 17A and 17B each illustrate an example of a display portion of one embodiment of the present invention.
Figure 17B:
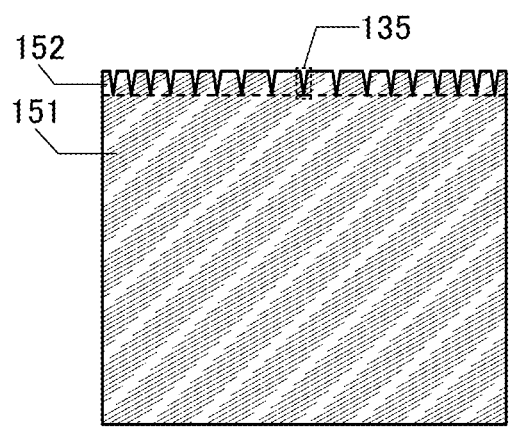

Detailed description is given of the case where the display portion 102 is provided in the electronic device 100 in FIG. 15A with reference to FIGS. 17A and 17B. FIG. 17A is a top view of the display portion 102. The display portion 102 preferably includes the display region 151 and the display region 152. When the display region 152 having a curved surface is provided, the housing 126 which has a curved side surface is prepared and the display portion 102 is deformed along the side surface of the housing 126. Furthermore, for example, in the display portion 102, cuts 135 may be provided in a region of the display region 152 as shown in FIG. 17B. By the cuts 135, creases and the like are not easily formed in the display region 152 in some cases, which is preferable.

Figure 18A:
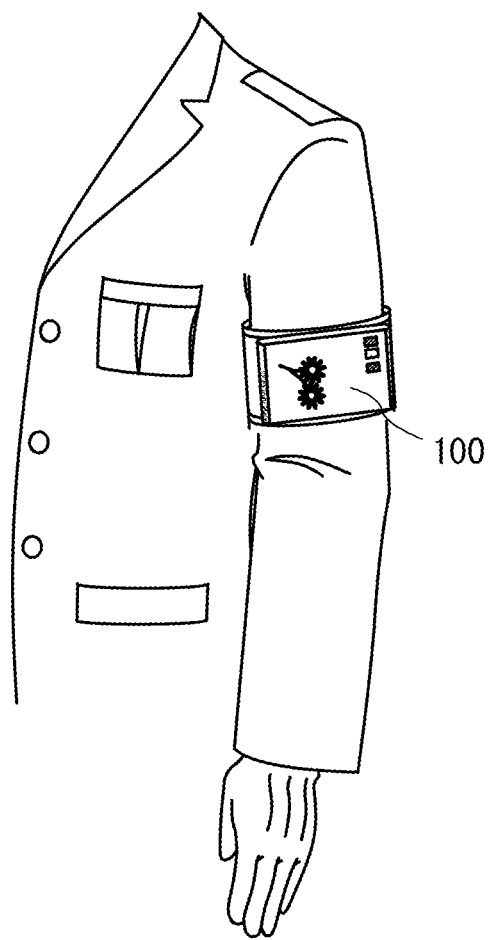
FIGS. 18A and 18B each illustrate one embodiment of the present invention.
Figure 18B:
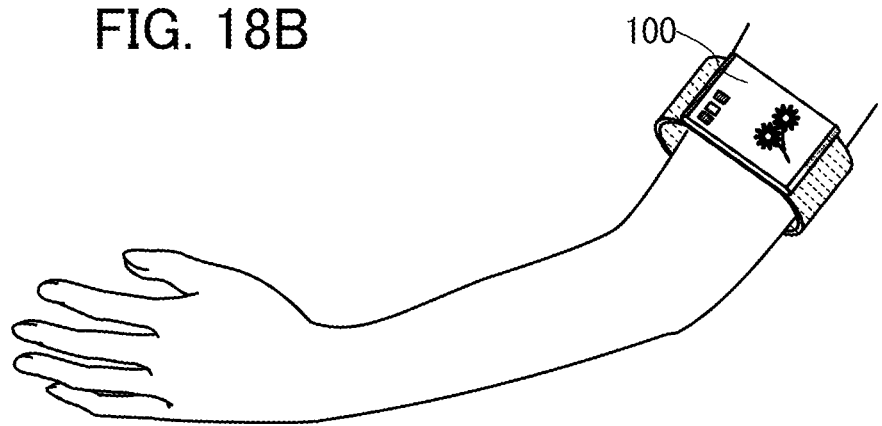

Next, an example of how to wear the electronic device 100 is described. In the example of FIG. 18A, the electronic device 100 is worn on the upper portion of an arm. In the example of FIG. 18B, the electronic device 100 is an armband device.

The screen size in the case where the electronic device 100 is provided with the display portion 102 is described. For example, in the case where the electronic device is worn on an arm, the maximum screen size is the product of an arm girth of 23 cm and a wrist-to-elbow length because the girth of an adult arm near a wrist is 18 cm±5 cm. The wrist-to-elbow length of an adult is shorter than or equal to a feet (30.48 cm); thus, the maximum screen size of the display portion that can be disposed over the support 125 in the form of a cylinder tube in the electronic device 100 that is worn on an arm is 23 cm×30.48 cm. Note that the screen size here does not refer to the size in a curved state but refers to the size in a flat state. A plurality of display portions may be provided in one electronic device; for example, a second display portion smaller than a first display portion may be included in an electronic device. The size of the support 125 is set larger than the screen size of the display portion. In the case of using EL elements, when the display portion is of such a screen size that it can be disposed over the support, the sum of the weights of the display portion 102 and the circuit board 106 can be more than or equal to 1 g and less than 10 g.

The thickness of the thinnest portion of the electronic device 100 provided with the display portion 102 can be less than or equal to 5 mm. The thickness of the thickest portion of the electronic device 100, which is a portion where the display portion 102 and the circuit board 106 are connected to each other, can be less than 1 cm.

The total weight of the electronic device 100 can be less than 100 g.

[Structure Example of Display Panel]

Next, a structure example of a display panel included in the display portion 102 is described with reference to the drawings.

Figure 19A:
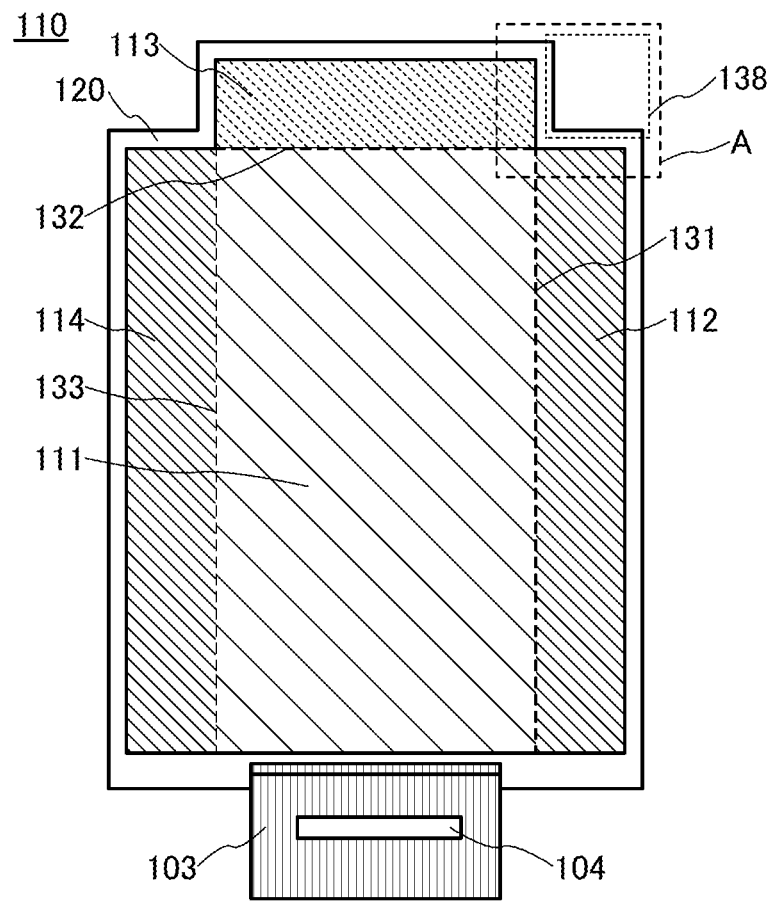
FIGS. 19A to 19C are structural examples of a display panel of one embodiment.

FIG. 19A is a schematic top view of a display panel 110 described below. The display panel 110 includes a flexible substrate 120 and a plurality of pixels over the substrate 120. The display panel 110 includes a first display region 111, a second display region 112, a third display region 113, and a fourth display region 114. Note that different hatching patterns of display regions are used here for clarification. The display regions 111 to 114 are continuously provided over the substrate 120. A continuous image may be displayed on two or more of the display regions 111 to 114.

The outline of the first display region 111 is a quadrangle. The second display region 112 is provided in contact with one (a first side 131) of four sides forming the outline of the first display region 111. The width of the first display region 111 preferably coincides with that of the second display region 112 in a direction parallel to the first side 131. The third display region 113 is provided in contact with a second side 132 which is in contact with the first side 131. The width of the first display region 111 preferably coincides with that of the third display region 113 in a direction parallel to the second side 132. Furthermore, a corner (first corner) formed by the first side 131 and the second side 132 preferably meets one of corners of the second display region 112 and one of corners of the third display region 113.

As illustrated in FIG. 19A, the substrate 120 includes a notch portion 138 in a region facing the first display region 111 with the first corner formed by the first side 131 and the second side 132 provided therebetween. Owing to the notch portion 138, the second display region 112 and the third display region 113 can be bent in different directions.

FIG. 19A illustrates a structure in which the fourth display region 114 is provided in contact with a third side 133 opposite to the first side 131. One of corner portions of the fourth display region 114 preferably meets a second corner portion formed by the second side 132 and the third side 133. The substrate 120 includes a notch portion similar to the notch portion 138 in a region facing the first display region 111 with the second corner portion provided therebetween. With such a structure, the fourth display region 114 and the third display region 113 can be bent in different directions.

Part of the substrate 120 is provided with an FPC 103 which supplies a signal and electric power for driving the pixels. Although FIG. 19A illustrates a structure in which an IC 104 is mounted on the FPC 103 by a COF method, the IC 104 is not necessarily provided. The IC 104 may be directly mounted on the substrate 120 by a COF method. Here, the width of the FPC 103 is preferably smaller than that of the first display region 111. Thus, particularly in the case where the second display region 112 and the fourth display region 114 are bent and the first display region 111 is flat, a junction portion of the FPC 103 and the substrate 120 is not bent and therefore, the FPC 103 can be prevented from being peeled.

Figure 19B:
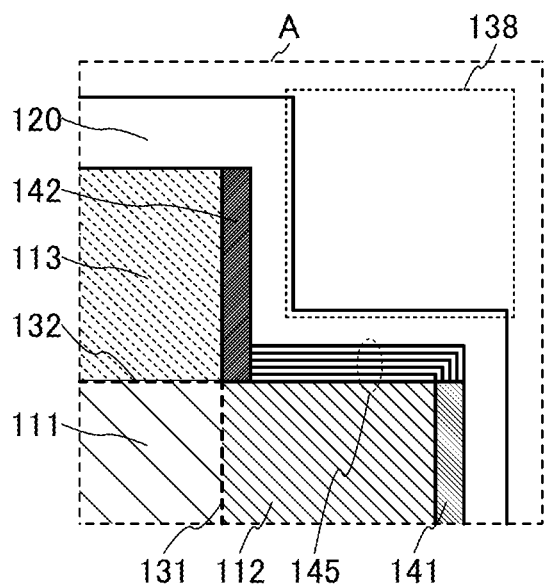

FIG. 19B is a schematic top view in which a region A in FIG. 19A is enlarged.

In FIG. 19B, a first driver circuit 141 which outputs a signal for driving pixels included in the first display region 111 and the second display region 112 to the first display region 111 and the second display region 112 and a second driver circuit 142 which outputs a signal for driving pixels included in the third display region 113 to the third display region 113 are provided. The first driver circuit 141 is provided along a side of the second display region 112 which is opposite to the first side 131. The second driver circuit 142 is provided along a side of the third display region 113 which is a side in a direction in which the first side 131 extends. The first driver circuit 141 and the second driver circuit 142 are electrically connected to each other through a wiring 145, and a signal input from the FPC 103 can be supplied to the second driver circuit 142 through the wiring 145.

Figure 19C:
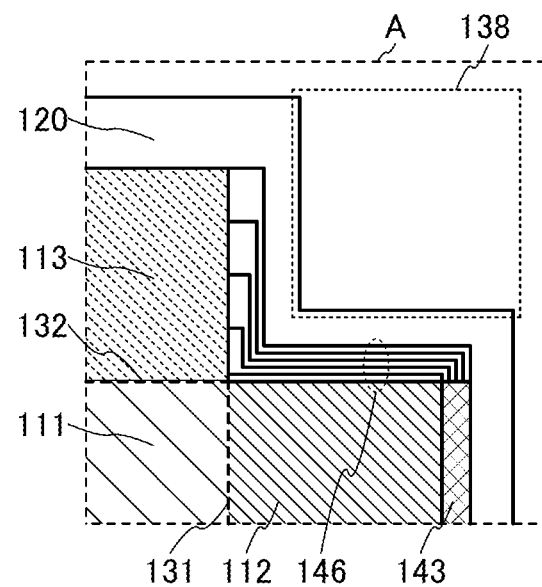

FIG. 19C illustrates a structure different from that in FIG. 19B. In FIG. 19C, a driver circuit 143 is provided instead of the first driver circuit 141. The driver circuit 143 can output a signal for driving pixels included in the first display region 111 and the second display region 112 and a signal for driving pixels included in the third display region 113. The signals output from the driver circuit 143 can be output to wirings electrically connected to the pixels in the third display region 113, through wirings 146.

As each of the first driver circuit 141, the second driver circuit 142, and the driver circuit 143, for example, a circuit serving as a gate driver circuit or a source driver circuit can be used; preferably, a gate driver circuit is used. In this case, the IC 104 preferably has a function as a source driver circuit.

Although a so-called driver integrated type display panel including a driver circuit over the substrate 120 is described here, a driver circuit is not necessarily provided over the substrate 120.

As described above, the second driver circuit 142 which outputs a signal for driving the pixels included in the third display region 113 or the wirings 146 which supplies a signal for driving the pixels is provided along the side of the third display region 113; thus, the area of the notch portion 138 can be increased and the area of a non-display portion with respect to a surface area of the display panel 110 can be reduced. In the case where the third display region 113 is bent in a direction parallel to the second side 132, a structure in which a driver circuit is not provided in a bent portion as illustrated in FIG. 19C is preferable. Since electrical characteristics of a semiconductor element such as a transistor in a driver circuit might be changed owing to stress caused by bending, instability of an output signal from the driver circuit can be prevented with such a structure.

Figure 20A:
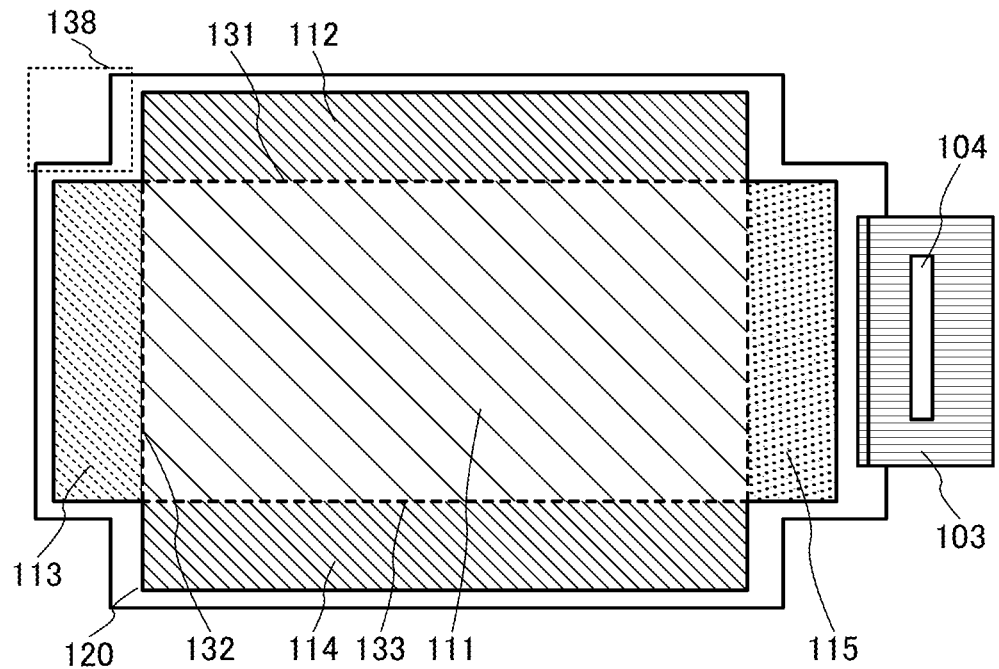
FIGS. 20A and 20B are structural examples of display panels of one embodiment.

Although FIGS. 19A to 19C illustrate the structure in which the first to fourth display regions are provided, the first to third display regions may be provided or a fifth display region 115 may be additionally provided. FIG. 20A is a schematic top view showing the case where the fifth display region 115 is provided. A wiring between the fifth display region 115 and the second display region 112 and a driver circuit may have structures similar to those in FIG. 19B or FIG. 19C.

Figure 20B:
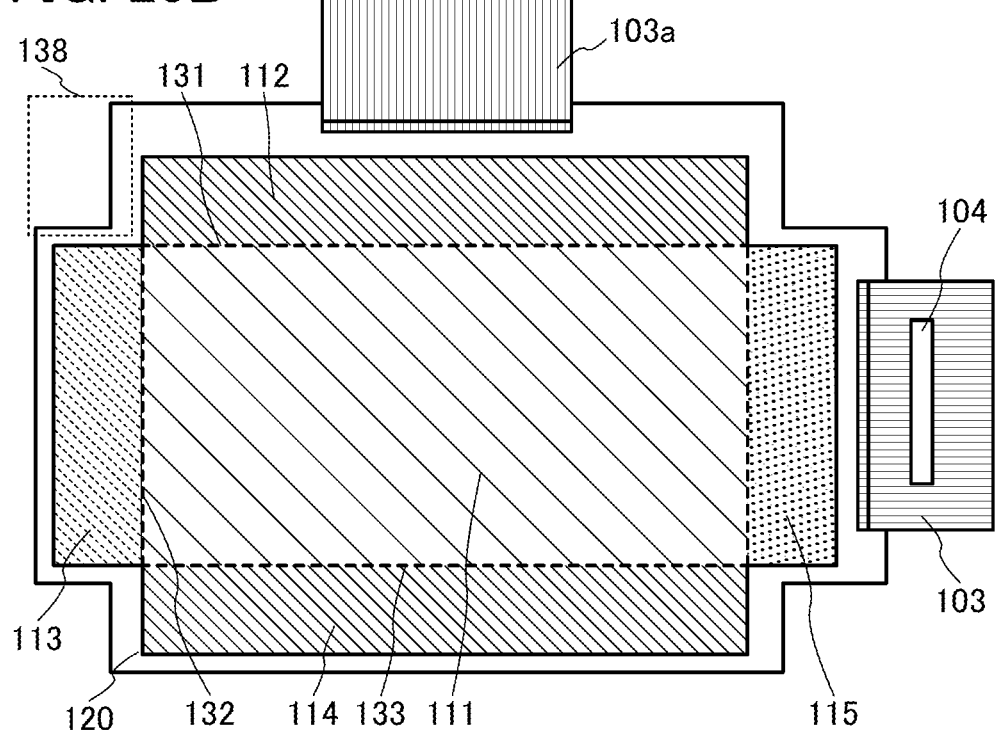

Furthermore, FIG. 20B illustrates an example of a structure where an FPC 103a is provided. The FPC 103a has a function of supplying a signal and electric power to, for example, the driver circuits described above. In the case where the display panel 110 does not include a driver circuit, an IC may be mounted on the FPC 103a by a COF method or the like.

Here, an oxide semiconductor is preferably used for semiconductor devices such as transistors used for pixels included in display regions or driver circuits in the display panel 110. In particular, an oxide semiconductor having a wider band gap than silicon is preferably used. A semiconductor material having a wider band gap and a lower carrier density than silicon is preferably used because off-state leakage current of the transistor can be reduced.

For example, the oxide semiconductor preferably contains at least indium (In) or zinc (Zn). The oxide semiconductor more preferably contains an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display panel which is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, an electronic device with an extremely low power consumption can be obtained.

Note that details of a preferable mode and a formation method of an oxide semiconductor that can be used for the semiconductor layer are described later in Embodiment 3.

In addition to the display device, the electronic device of one embodiment of the present invention may include another semiconductor circuit, e.g., a control circuit for preventing overcharge, an imaging element, a sensor such as a gyroscope sensor or an acceleration sensor, a touch panel, or the like. Furthermore, a sensor or the like for measuring a pulse, a surface temperature, a blood oxygen level, or the like by touch on part of a human body may be included. For example, when an imaging element is included in addition to the display device, a taken image can be displayed on the display device. When a sensor such as a gyroscope sensor or an acceleration sensor is included, the arm-worn electronic device can be powered on or off depending on the orientation or movement thereof to reduce power consumption. When a touch panel is included, the electronic device can be operated or information can be input by touching a predetermined position of the touch panel. When a memory and a CPU are included in addition to the display device in the above structure, a wearable computer can be obtained.

When the electronic device of one embodiment of the present invention is used as the display portion of the arm-worn electronic device together with a display portion of a conventional portable information terminal, the electronic device of one embodiment of the present invention can be used as a sub-display.

This embodiment can be freely combined with any of the other embodiments.

Embodiment 2

In this embodiment, specific examples of a display panel included in the electronic device of one embodiment of the present invention are described.

Specific Example 1

Figure 21A:
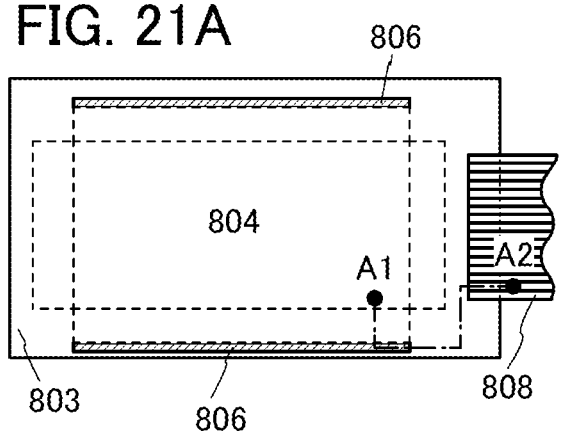
FIGS. 21A to 21D illustrate examples of display panels of one embodiment.
Figure 21B:
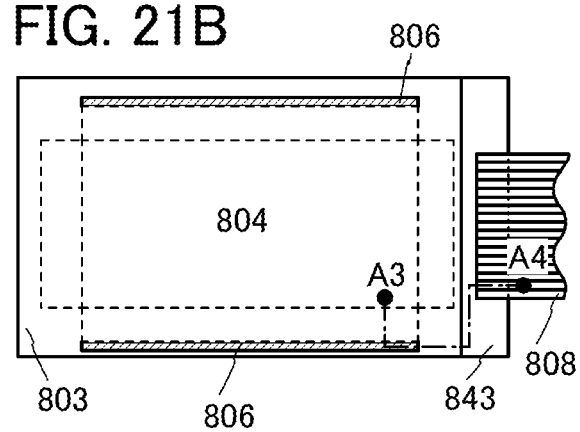
Figure 21C:
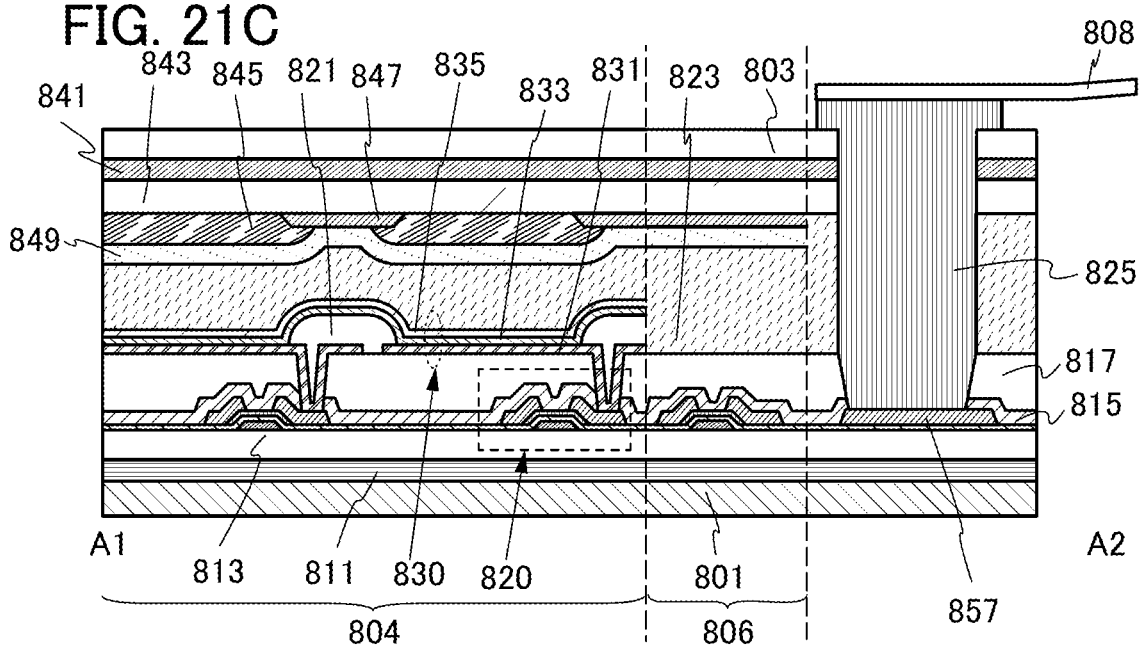

FIG. 21A is a plan view of the display panel, and FIG. 21C is an example of a cross-sectional view taken along the dashed-dotted line A1-A2 in FIG. 21A. The display panel in Specific Example 1 is a top-emission display panel using a color filter method. In this embodiment, the display panel can have, for example, a structure in which sub-pixels of three colors of red (R), green (G), and blue (B) express one color, or a structure in which sub-pixels of four colors of red (R), green (G), blue (B), and white (W) or sub-pixels of four colors of red (R), green (G), blue (B), and yellow (Y) express one color. The color element is not particularly limited and colors other than R, G, B, and W may be used. For example, yellow, cyan, magenta, and the like may be used.

The display panel illustrated in FIG. 21A includes a light-emitting portion 804, driver circuit portions 806, and a flexible printed circuit (FPC) 808. Light-emitting elements and transistors included in the light-emitting portion 804 and the driver circuit portions 806 are sealed by a substrate 801, a substrate 803, and a sealing layer 823.

The display panel illustrated in FIG. 21C includes the substrate 801, a bonding layer 811, an insulating layer 813, a plurality of transistors, a conductive layer 857, an insulating layer 815, an insulating layer 817, a plurality of light-emitting elements, an insulating layer 821, the sealing layer 823, an overcoat 849, a coloring layer 845, a light-blocking layer 847, an insulating layer 843, a bonding layer 841, and the substrate 803. The sealing layer 823, the overcoat 849, the insulating layer 843, the adhesive layer 841, and the substrate 803 transmit visible light.

The light-emitting portion 804 includes a transistor 820 and a light-emitting element 830 over the substrate 801 with the adhesive layer 811 and the insulating layer 813 provided between the substrate 801 and each of the transistor 820 and the light-emitting element 830. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 also includes the coloring layer 845 overlapping with the light-emitting element 830 and the light-blocking layer 847 overlapping with the insulating layer 821. The coloring layer 845 and the light-blocking layer 847 are covered with the overcoat 849. The space between the light-emitting element 830 and the overcoat 849 is filled with the sealing layer 823.

The insulating layer 815 has an effect of suppressing diffusion of impurities into a semiconductor included in the transistor. As the insulating layer 817, an insulating layer having a planarization function is preferably selected in order to reduce surface unevenness due to the transistor.

The driver circuit portions 806 each include a plurality of transistors over the substrate 801 with the adhesive layer 811 and the insulating layer 813 provided between the substrate 801 and the transistors. FIG. 21C illustrates one of the transistors included in the driver circuit portion 806.

The insulating layer 813 and the substrate 801 are attached to each other with the adhesive layer 811. The insulating layer 843 and the substrate 803 are attached to each other with the adhesive layer 841. It is preferable to use films with low water permeability for the insulating layer 813 and the insulating layer 843, in which case an impurity such as water can be prevented from entering the light-emitting element 830 or the transistor 820, leading to improved reliability of the display panel.

The conductive layer 857 is electrically connected to an external input terminal through which a signal (e.g., a video signal, a clock signal, a start signal, and a reset signal) or a potential from the outside is transmitted to the driver circuit portion 806. Here, an example is described in which an FPC 808 is provided as the external input terminal. To prevent an increase in the number of fabrication steps, the conductive layer 857 is preferably formed using the same material and step as the electrode or the wiring in the light-emitting portion or the driver circuit portion. Here, an example in which the conductive layer 857 is formed using the same material and step as the electrodes included in the transistor 820 is described.

In the display panel illustrated in FIG. 21C, a connector 825 is positioned over the substrate 803. The connector 825 is connected to the conductive layer 857 through an opening provided in the substrate 803, the adhesive layer 841, the insulating layer 843, the sealing layer 823, the insulating layer 817, and the insulating layer 815. The connector 825 is also connected to the FPC 808. The FPC 808 and the conductive layer 857 are electrically connected to each other via the connector 825. In the case where the conductive layer 857 overlaps with the substrate 803, the conductive layer 857, the connector 825, and the FPC 808 can be electrically connected to one another by forming an opening in the substrate 803 (or using a substrate having an opening portion).

The display panel in Specific Example 1 can be manufactured in the following manner: the insulating layer 813, the transistor 820, and the light-emitting element 830 are formed over a formation substrate with high heat resistance; the formation substrate is separated; and the insulating layer 813, the transistor 820, and the light-emitting element 830 are transferred to the substrate 801 and attached thereto with the adhesive layer 811. The display panel in Specific Example 1 can be manufactured in the following manner: the insulating layer 843, the coloring layer 845, and the light-blocking layer 847 are formed over a formation substrate with high heat resistance; the formation substrate is separated; and the insulating layer 843, the coloring layer 845, and the light-blocking layer 847 are transferred to the substrate 803 and attached thereto with the adhesive layer 841.

In the case where a material with low heat resistance (e.g., resin) is used for a substrate, it is difficult to expose the substrate to high temperatures in the manufacturing process. Thus, there is a limitation on conditions for forming a transistor and an insulating layer over the substrate. In the case of using a material with high water permeability (e.g., a resin), it is preferable to form a film at high temperatures to have low water permeability. In the manufacturing method of this embodiment, a transistor and the like can be formed over a formation substrate with high heat resistance; thus, a highly reliable transistor and a film with sufficiently low water permeability can be formed at high temperatures. Then, the transistor and the insulating film are transferred to the substrate 801 and the substrate 803, whereby a highly reliable display panel can be manufactured. Thus, with one embodiment of the present invention, a thin or/and lightweight display panel with high reliability can be provided. Details of the manufacturing method will be described later.

Specific Example 2

Figure 21D:
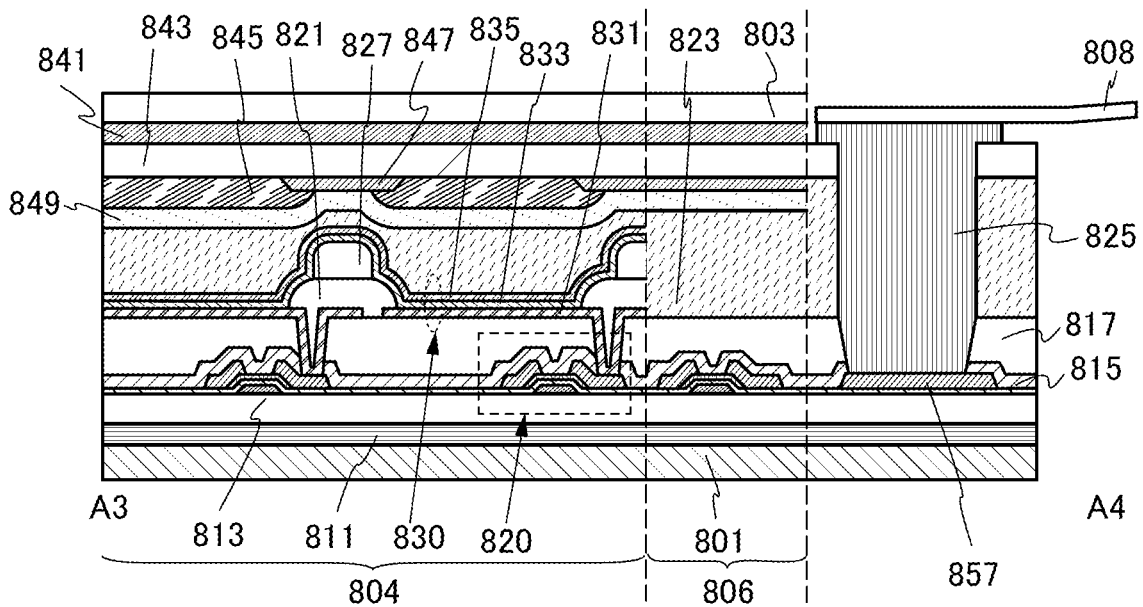

FIG. 21B is a plan view of the display panel, and FIG. 21D is an example of a cross-sectional view taken along the dashed-dotted line A3-A4 in FIG. 21B. The display panel in Specific Example 2 is a top-emission display panel using a color filter method, which differs from the display panel in Specific Example 1. Portions different from those in Specific Example 1 will be described in detail here and the descriptions of portions common to those in Specific Example 1 will be omitted.

The display panel illustrated in FIG. 21D differs from the display panel in FIG. 21C in the following points.

The display panel in FIG. 21D includes a spacer 827 over the insulating layer 821. The spacer 827 can adjust the distance between the substrate 801 and the substrate 803.

In the display panel illustrated in FIG. 21D, the substrate 801 and the substrate 803 have different sizes. The connector 825 is positioned over the insulating layer 843 and thus does not overlap with the substrate 803. The connector 825 is connected to the conductive layer 857 through an opening provided in the insulating layer 843, the sealing layer 823, the insulating layer 817, and the insulating layer 815. Since no opening needs to be provided in the substrate 803, there is no limitation on the material of the substrate 803.

Specific Example 3

FIG. 22A is a plan view of a display panel, and FIG. 22C is an example of a cross-sectional view taken along dashed-dotted line A5-A6 in FIG. 22A. The display panel in Specific Example 3 is a top-emission display device using a separate coloring method.

The display panel illustrated in FIG. 22A includes the light-emitting portion 804, the driver circuit portion 806, and the FPC 808. Light-emitting elements and transistors included in the light-emitting portion 804 and the driver circuit portion 806 are sealed by the substrate 801, the substrate 803, a frame-like sealing layer 824, and the sealing layer 823.

The display panel illustrated in FIG. 22C includes the substrate 801, the adhesive layer 811, the insulating layer 813, a plurality of transistors, the conductive layer 857, the insulating layer 815, the insulating layer 817, a plurality of light-emitting elements, the insulating layer 821, the sealing layer 823, the frame-like sealing layer 824, and the substrate 803. The sealing layer 823 and the substrate 803 transmit visible light.

The frame-shaped sealing layer 824 preferably has a higher gas barrier property than the sealing layer 823. Accordingly, external moisture or oxygen can be prevented from entering the display panel. Thus, a highly reliable display panel can be obtained.

In Specific Example 3, light emitted from the light-emitting element 830 in the display panel is extracted through the sealing layer 823. Therefore, the sealing layer 823 preferably has a higher light-transmitting property than the frame-shaped sealing layer 824. The sealing layer 823 preferably has a higher refractive index than the frame-shaped sealing layer 824. In addition, it is preferable that a reduction in the volume of the sealing layer 823 by curing be smaller than that of the frame-like sealing layer 824.

The light-emitting portion 804 includes a transistor 820 and a light-emitting element 830 over the substrate 801 with the adhesive layer 811 and the insulating layer 813 provided between the substrate 801 and each of the transistor 820 and the light-emitting element 830. The light-emitting element 830 includes the lower electrode 831 over the insulating layer 817, the EL layer 833 over the lower electrode 831, and the upper electrode 835 over the EL layer 833. The lower electrode 831 is electrically connected to the source electrode or the drain electrode of the transistor 820. The end portion of the lower electrode 831 is covered with the insulating layer 821. The lower electrode 831 preferably reflects visible light. The upper electrode 835 transmits visible light.

The driver circuit portion 806 each include a plurality of transistors over the substrate 801 with the adhesive layer 811 and the insulating layer 813 provided between the substrate 801 and the transistors. In FIG. 22C, one of the transistors included in the driver circuit portion 806 is illustrated.

The insulating layer 813 and the substrate 801 are attached to each other with the adhesive layer 811. It is preferable to use a film with low water permeability for the insulating layer 813, in which case an impurity such as water can be prevented from entering the light-emitting element 830 or the transistor 820, leading to improved reliability of the display panel.

The conductive layer 857 is electrically connected to an external input terminal through which a signal or a potential from the outside is transmitted to the driver circuit portion 806. Here, an example is described in which an FPC 808 is provided as the external input terminal. Moreover, here, an example in which the conductive layer 857 is formed using the same material and step as the electrodes included in the transistor 820 is described.

In the display panel illustrated in FIG. 22C, the connector 825 is positioned over the substrate 803. The connector 825 is connected to the conductive layer 857 through an opening provided in the substrate 803, the sealing layer 823, the insulating layer 817, and the insulating layer 815. The connector 825 is also connected to the FPC 808. The FPC 808 and the conductive layer 857 are electrically connected to each other via the connector 825.

The display panel in Specific Example 3 can be manufactured in the following manner: the insulating layer 813, the transistor 820, and the light-emitting element 830 are formed over a formation substrate with high heat resistance; the formation substrate is separated; and the insulating layer 813, the transistor 820, and the light-emitting element 830 are transferred to the substrate 801 and attached thereto with the adhesive layer 811. In the manufacturing method of this embodiment, a transistor and the like can be formed over a formation substrate with high heat resistance; thus, a highly reliable transistor and a film with sufficiently low water permeability can be formed at high temperatures. Then, the transistor and the insulating film are transferred to the substrate 801, whereby a highly reliable display panel can be manufactured. Thus, according to one embodiment of the present invention, a thin or/and lightweight display panel with high reliability can be provided.

Specific Example 4

FIG. 22B is a plan view of a display panel, and FIG. 22D is an example of a cross-sectional view taken along dashed-dotted line A7-A8 in FIG. 22B. The display panel in Specific Example 4 is a bottom-emission display panel using a color filter method.

The display panel illustrated in FIG. 22D includes the substrate 801, the adhesive layer 811, the insulating layer 813, a plurality of transistors, the conductive layer 857, the insulating layer 815, the coloring layer 845, an insulating layer 817a, an insulating layer 817b, a conductive layer 816, a plurality of light-emitting elements, the insulating layer 821, the sealing layer 823, and the substrate 803. The substrate 801, the adhesive layer 811, the insulating layer 813, the insulating layer 815, the insulating layer 817a, and the insulating layer 817b transmit visible light.

The light-emitting portion 804 includes the transistor 820, the transistor 822, and the light-emitting element 830 over the substrate 801 with the adhesive layer 811 and the insulating layer 813 provided between the substrate 801 and each of the transistor 820, the transistor 822, and the light-emitting element 830. The light-emitting element 830 includes the lower electrode 831 over the insulating layer 817b, the EL layer 833 over the lower electrode 831, and the upper electrode 835 over the EL layer 833. The lower electrode 831 is electrically connected to the source electrode or the drain electrode of the transistor 820. The end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

The driver circuit portion 806 include a plurality of transistors over the substrate 801 with the adhesive layer 811 and the insulating layer 813 provided between the substrate 801 and the transistors. In FIG. 22D, two of the transistors included in the driver circuit portion 806 is illustrated.

The insulating layer 813 and the substrate 801 are attached to each other with the adhesive layer 811. It is preferable to use a film with low water permeability for the insulating layer 813, in which case an impurity such as water can be prevented from entering the light-emitting element 830, the transistor 820, or the transistor 822, leading to improved reliability of the display panel.

The conductive layer 857 is electrically connected to an external input terminal through which a signal or a potential from the outside is transmitted to the driver circuit portion 806. Here, an example is described in which the FPC 808 is provided as the external input terminal. Moreover, here, an example in which the conductive layer 857 is formed using the same material and step as the conductive layer 816 is described.

The display panel in Specific Example 4 can be manufactured in the following manner: the insulating layer 813, the transistor 820, the light-emitting element 830, and the like are formed over a formation substrate with high heat resistance; the formation substrate is separated; and the insulating layer 813, the transistor 820, the light-emitting element 830, and the like are transferred to the substrate 801 and attached thereto with the adhesive layer 811. In the manufacturing method of this embodiment, a transistor and the like can be formed over a formation substrate with high heat resistance; thus, a highly reliable transistor and a film with sufficiently low water permeability can be formed at high temperatures. Then, the transistor and the insulating film are transferred to the substrate 801, whereby a highly reliable display panel can be manufactured. Thus, according to one embodiment of the present invention, a thin or/and lightweight display panel with high reliability can be provided.

Specific Example 5

FIG. 22E illustrates an example of a display panel that is different from those described in Specific Examples 1 to 4.

The display panel illustrated in FIG. 22E includes the substrate 801, the adhesive layer 811, the insulating layer 813, a conductive layer 814, a conductive layer 857a, a conductive layer 857b, the light-emitting element 830, the insulating layer 821, the sealing layer 823, and the substrate 803.

The conductive layer 857a and the conductive layer 857b, which serve as external connection electrodes of the display panel, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 is a bottom-emission, top-emission, or dual-emission light-emitting element. An electrode, a substrate, an insulating layer, and the like on the light extraction side transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, the substrate with a light extraction structure can be formed by attaching the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be prevented. In addition, for a similar purpose, a conductive layer electrically connected to the upper electrode 835 may be provided over the insulating layer 821, the EL layer 833, the upper electrode 835, or the like.

The conductive layer 814 can be a single layer or a stacked layer formed using a material selected from copper, titanium, tantalum, tungsten, molybdenum, chromium, neodymium, scandium, nickel, or aluminum; an alloy material containing any of these materials as its main component; or the like. The thickness of the conductive layer 814 can be, for example, greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 835, metal particles forming the conductive layer aggregate; therefore, the surface of the conductive layer is rough and has many gaps. Thus, it is difficult for the EL layer 833 to completely cover the conductive layer; accordingly, the upper electrode and the conductive layer are preferably electrically connected to each other easily.

The display panel in Specific Example 5 can be manufactured in the following manner: the insulating layer 813, the light-emitting element 830, and the like are formed over a formation substrate with high heat resistance; the formation substrate is separated; and the insulating layer 813, the light-emitting element 830, and the like are transferred to the substrate 801 and attached thereto with the adhesive layer 811. A film with sufficiently low water permeability is formed at high temperature over the formation substrate having high heat resistance and transferred to the substrate 801, whereby a highly reliable display panel can be manufactured. Thus, according to one embodiment of the present invention, a thin or/and lightweight display panel with high reliability can be provided.

Note that although the case where the light-emitting element is used as a display element is described here, one embodiment of the present invention is not limited thereto.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Examples of Materials

Next, materials and the like that can be used for a light-emitting panel are described. Note that description on the components already described in this specification is omitted in some cases.

For each of the substrates, a material such as glass, quartz, an organic resin, a metal, or an alloy can be used. For the substrate on the side from which light from the light-emitting element is extracted, a material which transmits that light is used.

It is particularly preferable to use a flexible substrate. For example, an organic resin; a glass material, a metal, or an alloy that is thin enough to have flexibility; or the like can be used.

An organic resin, which has a specific gravity smaller than that of glass, is preferably used for the flexible substrate, in which case the light-emitting panel can be more lightweight than in the case where glass is used.

The substrates are preferred to be formed using a material with high toughness. In that case, a light-emitting panel with high impact resistance that is robust can be provided. For example, when an organic resin substrate, a thin metal substrate, or a thin alloy substrate is used, the light-emitting panel can be lighter and more robust than the case where a glass substrate is used.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 μm and less than or equal to 200 μm, further preferably greater than or equal to 20 μm and less than or equal to 50 μm.

Examples of a material for the metal substrate or the alloy substrate include, but not limited to, a metal such as aluminum, copper, iron, titanium, or nickel; and an alloy containing one or more metals selected from the metals. As the alloy, for example, an aluminum alloy or stainless steel can be favorably used.

Furthermore, when a material with high thermal emissivity is used for the substrate, the surface temperature of the light-emitting panel can be prevented from rising, leading to prevention of breakage or a decrease in reliability of the light-emitting panel. For example, the substrate may have a stacked-layer structure of a metal substrate and a layer with high thermal emissivity (e.g., the layer can be formed using a metal oxide or a ceramic material).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose coefficient of thermal expansion is low is preferred, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (such as a silicon nitride layer) by which a surface of a light-emitting device is protected from damage, a layer (such as an aramid resin layer) that can disperse pressure, or the like is stacked over a layer of any of the above-mentioned materials.

The flexible substrate may be formed by stacking a plurality of layers. When a glass layer is used, a barrier property against water and oxygen can be improved and thus a reliable light-emitting panel can be provided.

For example, a flexible substrate in which a glass layer, an adhesive layer, and an organic resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both an excellent barrier property against water and oxygen and a high flexibility. The thickness of the organic resin layer is greater than or equal to 10 µm and less than or equal to 200 µm, preferably greater than or equal to 20 µm and less than or equal to 50 µm. Providing such organic resin layer outside the glass layer, occurrence of a crack or a break in the glass layer can be suppressed and mechanical strength can be improved. With the substrate that includes such a composite material of a glass material and an organic resin, a highly reliable and flexible light-emitting panel can be provided.

As the adhesive layer or the sealing layer, a variety of curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. A material with low moisture permeability, such as an epoxy resin, is particularly preferable. Alternatively, a two-component-mixture-type resin may be used. Alternatively, an adhesive sheet or the like may be used.

The resin may include a drying agent. As the drying agent, for example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the functional element, thereby improving the reliability of the light-emitting panel.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

There is no particular limitation on the structure of the transistors in the light-emitting panel. For example, a forward staggered transistor or an inverted staggered transistor may be used. A top-gate transistor or a bottom-gate transistor may be used. There is no particular limitation on a semiconductor material used for the transistors; for example, silicon, germanium, silicon carbide, or gallium nitride can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

Here, an oxide semiconductor is preferably used for semiconductor devices such as transistors used for pixels, driver circuits, touch sensors described later, and the like. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display panel which is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, an electronic device with an extremely low power consumption can be obtained.

For stable characteristics of the transistor, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above Structure Examples, the insulating layer 813 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an ink-jet method, a coating method, and the like.

In the case where a light-emitting element emitting white light is used as the light-emitting element 830, the EL layer 833 preferably contains two or more kinds of light-emitting substances. For example, light-emitting substances are selected so that two or more light-emitting substances emit complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element 830 preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

More preferably, a light-emitting layer containing a light-emitting material emitting light of one color and a light-emitting layer containing a light-emitting material emitting light of another color are stacked in the EL layer 833. For example, the plurality of light-emitting layers in the EL layer 833 may be stacked in contact with each other or may be stacked with a separation layer therebetween. For example, a separation layer may be provided between a fluorescent layer and a phosphorescent layer.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer contains a host material, an assist material, and the phosphorescent material (a guest material), the separation layer may contain the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing cost can be reduced.

The light-emitting element 830 may be a single element including one EL layer or a tandem element in which a plurality of EL layers are stacked with a charge generation layer therebetween.

The light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon such as a silicon nitride film or a silicon nitride oxide film, a film containing nitrogen and aluminum such as an aluminum nitride film, or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m²·day], preferably lower than or equal to $1\times10^{-6}$ [g/m²·day], further preferably lower than or equal to $1\times10^{-7}$ [g/m²·day], still further preferably lower than or equal to $1\times10^{-8}$ [g/m²·day].

The insulating layers 813 and 843 are each preferably formed using an insulating film with low water permeability.

As the insulating layer 815, for example, an inorganic insulating film such as a silicon oxide film, a silicon oxynitride film, or an aluminum oxide film can be used. For example, as each of the insulating layers 817, 817a, and 817b, an organic material such as polyimide, acrylic, polyamide, polyimide amide, or a benzocyclobutene-based resin can be used. Alternatively, a low-dielectric constant material (a low-k material) or the like can be used. Furthermore, each of the insulating layers may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed using a photosensitive resin material so that a sidewall of an opening has an inclined surface with continuous curvature.

There is no particular limitation on the method for forming the insulating layer 821; a photolithography method, a sputtering method, an evaporation method, a droplet discharging method (e.g., an ink-jet method), a printing method (e.g., a screen printing method or an off-set printing method), or the like may be used.

The spacer 827 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 827 containing a conductive material and the upper electrode 835 are electrically connected to each other, a potential drop due to the resistance of the upper electrode 835 can be suppressed. The spacer 827 may have either a tapered shape or an inverse tapered shape.

A conductive layer included in the light-emitting panel, which functions as an electrode or a wiring of the transistor, an auxiliary electrode of the light-emitting element, or the like, can be formed to have a single-layer structure or a stacked-layer structure using any of metal materials such as molybdenum, titanium, chromium, tantalum, tungsten, aluminum, copper, neodymium, and scandium, and an alloy material containing any of these elements, for example.

Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer is provided between the adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be suppressed. As the light-blocking layer, a material that can block light from the light-emitting element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. With the overcoat, impurities and the like contained in the coloring layer can be prevented from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and a stacked-layer structure of an organic insulating film and an inorganic insulating film may be used.

In the case where upper surfaces of the coloring layer and the light-blocking layer are coated with a material of the sealing layer, a material that has high wettability with respect to the material of the sealing layer is preferably used as the material of the overcoat. For example, an oxide conductive film such as an ITO film or a metal film such as an Ag film that is thin enough to transmit light is preferably used as the overcoat.

For the connector, it is possible to use a paste-like or sheet-like material which is obtained by mixing metal particles into a thermosetting resin and for which anisotropic electric conductivity is provided by thermocompression bonding. As the metal particles, particles in which two or more kinds of metals are layered, for example, nickel particles coated with gold are preferably used. Alternatively, a particulate resin whose surface is coated with a metal is preferably used.

This embodiment can be freely combined with any of the other embodiments.

Embodiment 3

In this embodiment, a structure of an oxide semiconductor which can be used for one embodiment of the present invention is described.

A structure of the oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appear at around $31°$ and a peak of $2\theta$ not appear at around $36°$.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a crystal grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part can be found in some cases. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Consequently, focusing on the lattice fringes in the high-resolution TEM image, lattice fringes with a spacing ranging from 0.28 nm to 0.30 nm each correspond to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be freely combined with any of the other embodiments.

Embodiment 4

In this embodiment, an example of a method for charging a power storage device by wireless power feeding will be described. For wireless power feeding, an electric field, a magnetic field, an electromagnetic wave, or the like can be used.

An electronic device of one embodiment of the present invention preferably includes an antenna, a coil, or the like for receiving an electric field, a magnetic field, an electromagnetic wave, or the like. The electronic device of one embodiment of the present invention preferably includes a capacitor for charging.

When a coupling coil and a coupling capacitor are used, the power storage device can be charged without contact. An antenna can be used instead of a coupling coil. Here, a secondary battery is used as a power storage device, for example. By an electromagnetic induction method in which a primary coil of a charger and a secondary coil of the electronic device are magnetically coupled and a voltage is generated at the secondary coil with an alternating magnetic field generated from the primary coil, electric power is transmitted to the secondary coil side without contact. Through this mechanism, the secondary battery is charged. It is preferable that the coil be provided in contact with a curved surface of a structure body; therefore, it is preferable that the coil of the electronic device be provided over a flexible film. Here, the coil provided in the electronic device may be used as an antenna.

The secondary battery in an arm-worn electronic device including a display module may be provided with an antenna for purposes other than contactless charging of the secondary battery. A memory may be further provided, and an antenna that enables electronic data transmission and reception or an antenna that enables display of position or time with a GPS function by obtaining positional information or GPS time may be provided.

Since an electronic device is to be in contact with part of a human body, it is preferable for safety that input and output terminals for charging or discharging a secondary battery be not exposed. In the case where the input and output terminals are exposed, the input and output terminals might be short-circuited by water such as rain, or the input and output terminals might be in contact with a human body and cause an electric shock. The use of an antenna enables a structure in which the input and output terminals are not exposed on a surface of the electronic device.

Note that this embodiment is the same as Embodiment 1 except that an antenna, a coil, and a converter for wireless power feeding are provided; therefore, the other components are not described in detail here.

As in Embodiment 1, a power storage device, here, a secondary battery is fixed to a board, and a display module is attached to the secondary battery. The secondary battery preferably has a bent shape. Furthermore, the secondary battery is preferably flexible. A converter for wireless power feeding and an antenna which are electrically connected to the secondary battery are provided. The converter for wireless power feeding is fixed so as to overlap with part of a display portion.

The converter for wireless power feeding and the antenna weigh less than or equal to 10 g, and the total weight does not significantly differ from that in Embodiment 1.

Figure 23:
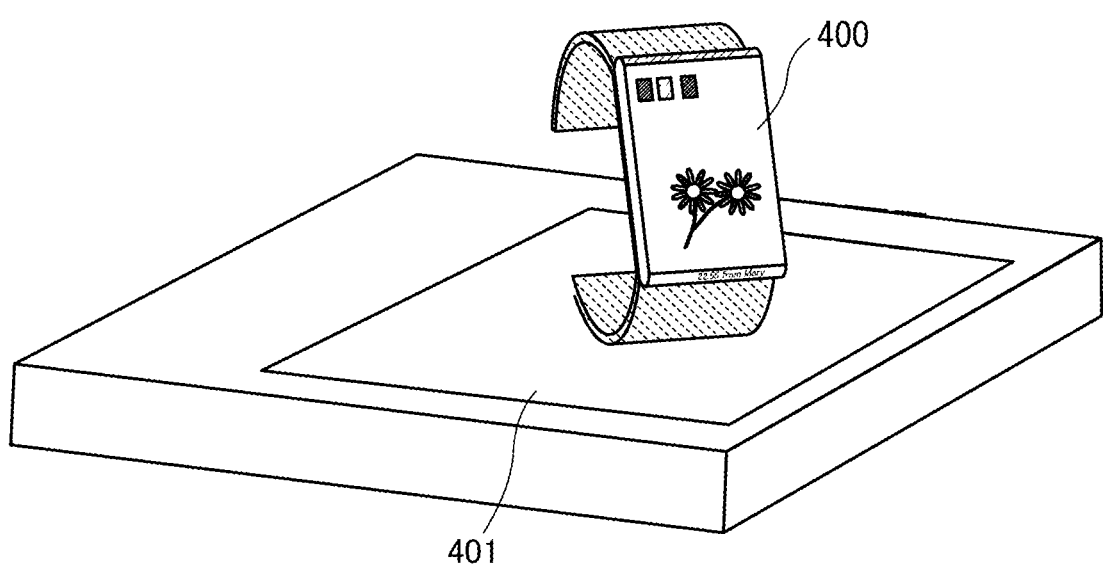
FIG. 23 is a perspective view illustrating one embodiment of the present invention.

FIG. 23 is a schematic diagram of an electronic device 400 including an antenna (not illustrated) and a charger 401. When the electronic device 400 is disposed over the charger 401, electric power can be supplied from an antenna of the charger 401 to the electronic device 400 to charge a secondary battery of the electronic device 400.

Information such as the remaining amount or time to full charge can be displayed on a display portion of the electronic device 400.

This embodiment can be freely combined with any of the other embodiments.

Embodiment 5

In this embodiment, the storage battery 108 having flexibility which can be used for one embodiment of the present invention is described.

Figure 24:
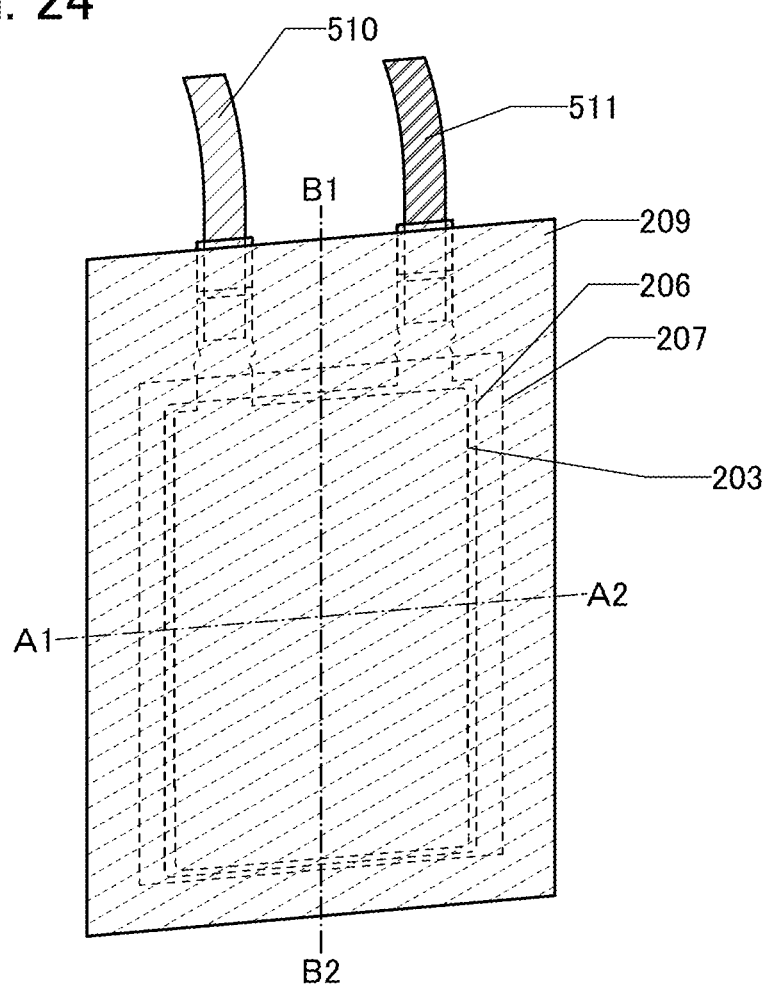
FIG. 24 is an external view of a storage battery of one embodiment of the present invention.
Figure 25A:
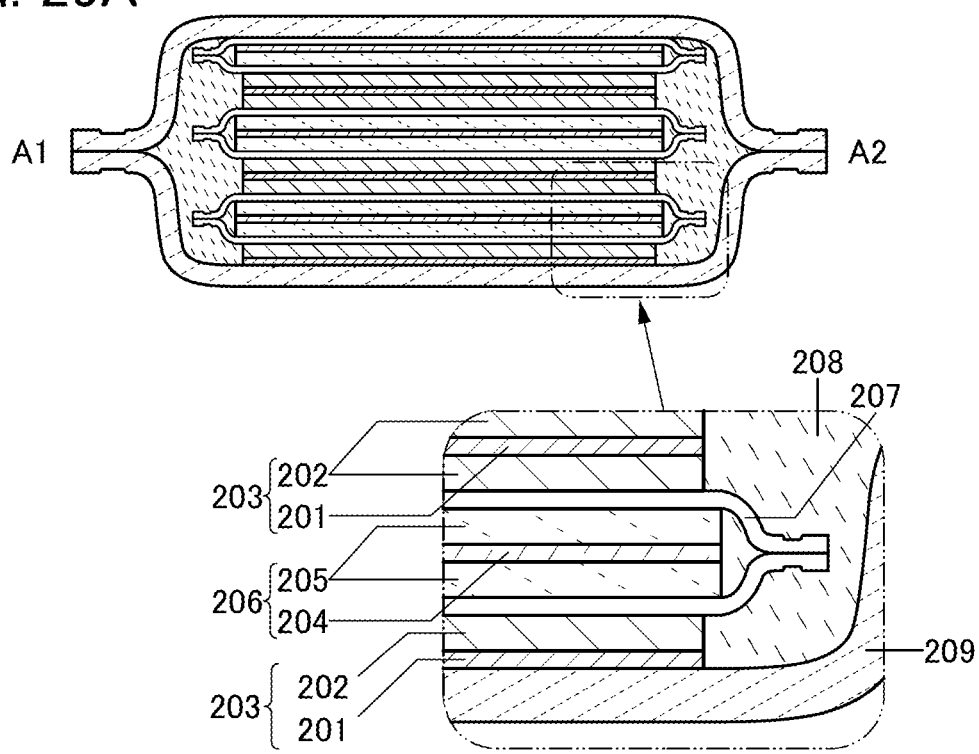
FIGS. 25A and 25B are cross-sectional views each illustrating a storage battery of one embodiment of the present invention.
Figure 25B:
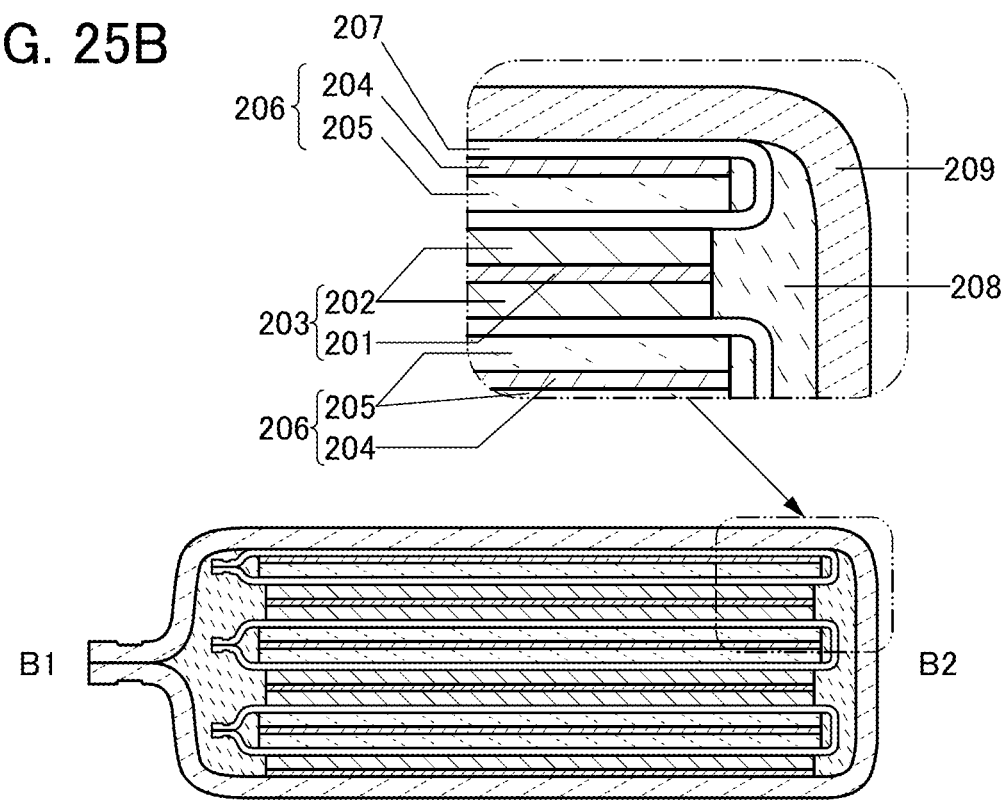

In this embodiment, an example of using, as the storage battery 108 having flexibility, a thin secondary battery whose exterior body includes a film is described. FIG. 24 is an external view of the thin secondary battery. FIG. 25A illustrates a cross section taken along the dashed-dotted line A1-A2 in FIG. 24, and FIG. 25B illustrates a cross section taken along the dashed-dotted line B1-B2 in FIG. 24.

The thin secondary battery includes a sheet-like positive electrode 203, a sheet-like negative electrode 206, a separator 207, an electrolytic solution 208, an exterior body 209 made of a film, a positive electrode lead electrode 510, and a negative electrode lead electrode 511. The separator 207 is provided between the positive electrode 203 and the negative electrode 206 in the exterior body 209. The exterior body 209 is filled with the electrolytic solution 208. Note that the positive electrode 203 includes a positive electrode current collector 201 and a positive electrode active material layer 202. The negative electrode 206 includes a negative electrode current collector 204 and a negative electrode active material layer 205.

There is no particular limitation on the materials of the positive electrode current collector 201 and the negative electrode current collector 204 as long as it has high conductivity without causing a significant chemical change in the power storage device. For example, the positive electrode current collector 201 and the negative electrode current collector 204 can be formed using a metal such as gold, platinum, zinc, iron, nickel, copper, aluminum, titanium, or tantalum, an alloy thereof (e.g., stainless steel), an alloy of the aforementioned metal and another metal, or the like. Alternatively, an aluminum alloy to which an element which improves heat resistance, such as silicon, titanium, neodymium, scandium, or molybdenum, is added can be used. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The positive electrode current collector 201 and the negative electrode current collector 204 can each have a foil-like shape, a plate-like shape (sheet-like shape), a net-like shape, a cylindrical shape, a coil shape, a punching-metal shape, an expanded-metal shape, or the like as appropriate. The positive electrode current collector 201 and the negative electrode current collector 204 each preferably have a thickness greater than or equal to 5 μm and less than or equal to 30 μm.

For the positive electrode active material layer 202, a material into and from which carrier ions can be inserted and extracted can be used. For example, a lithium-containing material with an olivine crystal structure, a layered rock-salt crystal structure, and a spinel crystal structure can be used. As a metal which serves as the carrier ions, an alkali metal (e.g., lithium sodium or potassium), an alkaline earth metal (e.g., calcium, strontium, or barium), beryllium, magnesium, or the like can be used, for example.

In the case of using lithium as the carrier ions, for example, a compound such as $LiFeO_2$, $LiCoO_2$, $LiNiO_2$, $LiMn_2O_4$, $V_2O_5$, $Cr_2O_5$, or $MnO_2$ can be used for the positive electrode active material.

Alternatively, a lithium-containing complex phosphate ($LiMPO_4$ (general formula) (M is at least one of Fe(II), Mn(II), Co(II), and Ni(II))) can be used. Typical examples of the general formula $LiMPO_4$ include $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ (a+b≤1, 0<a<1, and 0<b<1), $LiFe_cNi_dCo_ePO_4$, $LiFe_cNi_dMn_ePO_4$, $LiNi_cCo_dMn_ePO_4$ (c+d+e≤1, 0<c<1, 0<d<1, and 0<e<1), and $LiFe_fNi_gCo_hMn_iPO_4$ (f+g+h+i≤1, 0<f<1, 0<g<1, 0<h<1, and 0<i<1). $LiFePO_4$ is particularly preferable because it properly satisfies conditions necessary for the positive electrode active material, such as safety, stability, high capacity density, high potential, and the existence of lithium ions which can be extracted in initial oxidation (charging).

Examples of the lithium-containing material with a layered rock-salt crystal structure include lithium cobalt oxide ($LiCoO_2$); $LiNiO_2$; $LiMnO_2$; $Li_2MnO_3$; an NiCo-based lithium-containing material (general formula: $LiNi_xCo_{1-x}O_2$ ($0<x<1$)) such as $LiNi_{0.8}Co_{0.2}O_2$; an NiMn-based lithium-containing material (general formula: $LiNi_xMn_{1-x}O_2$ ($0<x<1$)) such as $LiNi_{0.5}Mn_{0.5}O_2$; and an NiMnCo-based lithium-containing material (also referred to as NMC, and general formula: $LiNi_xMn_yCo_{1-x-y}O_2$ ($x>0$, $y>0$, $x+y<1$)) such as $LiNi_{1/3}Mn_{1/3}Co_{1/3}O_2$. Moreover, $Li(Ni_{0.8}Co_{0.15}Al_{0.05})O_2$, $Li_2MnO_3$-$LiMO_2$ (M is Co, Ni, or Mn), and the like can be given.

Examples of the lithium-containing material with a spinel crystal structure include $LiMn_2O_4$, $Li_{1+x}Mn_{2-x}O_4$, $Li(MnAl)_2O_4$, and $LiMn_{1.5}Ni_{0.5}O_4$.

It is preferable to add a small amount of lithium nickel oxide ($LiNiO_2$ or $LiNi_{1-x}MO_2$ (M=Co, Al, or the like)) to a lithium-containing material with a spinel crystal structure which contains manganese such as $LiMn_2O_4$ because advantages such as minimization of the elution of manganese and the decomposition of an electrolytic solution can be obtained.

Alternatively, a lithium-containing material such as $Li_{(2-j)}MSiO_4$ (general formula, and M is one or more of Fe(II), Mn(II), Co(II), and Ni(II), $0 \leq j \leq 2$) can be used for the positive electrode active material. Typical examples of the general formula $Li_{(2-j)}MSiO_4$ which can be used as a material are lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ ($k+l \leq 1$, $0<k<1$, and $0<l<1$), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ ($m+n+q \leq 1$, $0<m<1$, $0<n<1$, and $0<q<1$), and $Li_{(2-j)}Fe_rNi_sCo_tMn_uSiO_4$ ($r+s+t+u \leq 1$, $0<r<1$, $0<s<1$, $0<t<1$, and $0<u<1$).

Still alternatively, a nasicon compound expressed by $A_xM_2(XO_4)_3$ (general formula) (A=Li, Na, or Mg, M=Fe, Mn, Ti, V, Nb, or Al, X=S, P, Mo, W, As, or Si) can be used as the positive electrode active material. Examples of the nasicon compound are $Fe_2(MnO_4)_3$, $Fe_2(SO_4)_3$, and $Li_3Fe_2(PO_4)_3$. Further alternatively, a compound expressed by $Li_2MPO_4F$, $Li_2MP_2O_7$, or $Li_5MO_4$ (general formula) (M=Fe or Mn), a perovskite fluoride such as $NaF_3$ and $FeF_3$, a metal chalcogenide (a sulfide, a selenide, or a telluride) such as $TiS_2$ and $MoS_2$, a material with an inverse spinel structure such as $LiMVO_4$, a vanadium oxide ($V_2O_5$, $V_6O_{13}$, $LiV_3O_8$, or the like), a manganese oxide, an organic sulfur compound, or the like can be used as the positive electrode active material.

The positive electrode active material layer 202 may further include a binder for increasing adhesion of active materials, a conductive additive for increasing the conductivity of the positive electrode active material layer 202, and the like in addition to the above-described positive electrode active materials.

A material with which a metal to be carrier ions can be dissolved and precipitated or a material into and from which carrier ions can be inserted and extracted can be used for the negative electrode active material layer 205; for example, a lithium metal, a carbon-based material, or an alloy-based material can be used. Here, an alloy-based material refers to, for example, a material which enables charge-discharge reactions by an alloying reaction and a dealloying reaction with carrier ions.

The lithium metal is preferable because of its low redox potential (3.045 V lower than that of a standard hydrogen electrode) and high specific capacity per unit weight and per unit volume (3860 mAh/g and 2062 mAh/cm$^3$).

Examples of the carbon-based material include graphite, graphitizing carbon (soft carbon), non-graphitizing carbon (hard carbon), a carbon nanotube, graphene, carbon black, and the like.

Examples of the graphite include artificial graphite such as meso-carbon microbeads (MCMB), coke-based artificial graphite, or pitch-based artificial graphite and natural graphite such as spherical natural graphite.

Graphite has a low potential substantially equal to that of a lithium metal (lower than or equal to 0.3 V vs. Li/Li$^+$) when lithium ions are inserted into the graphite (while a lithium-graphite intercalation compound is formed). For this reason, a lithium-ion secondary battery can have a high operating voltage. In addition, graphite is preferable because of its advantages such as relatively high capacity per unit volume, small volume expansion, low cost, and safety greater than that of a lithium metal.

As the negative electrode active material, an alloy-based material can be used. For example, in the case where carrier ions are lithium ions, a material including at least one of Mg, Ca, Al, Si, Ge, Sn, Pb, Sb, As, Bi, Ag, Au, Zn, Cd, Hg, In, and the like can be used. Such elements have higher capacity than carbon. In particular, silicon has a significantly high theoretical capacity of 4200 mAh/g. For this reason, silicon is preferably used as the negative electrode active material. Examples of the material using such elements include SiO, $Mg_2Si$, $Mg_2Ge$, $SnO$, $SnO_2$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, $InSb$, $SbSn$, and the like.

Alternatively, as the negative electrode active material, an oxide such as titanium dioxide ($TiO_2$), lithium titanium oxide ($Li_4Ti_5O_{12}$), lithium-graphite intercalation compound ($Li_xC_6$), niobium pentoxide ($Nb_2O_5$), tungsten oxide ($WO_2$), or molybdenum oxide ($MoO_2$) can be used.

Still alternatively, as the negative electrode active material, $Li_{3-x}M_xN$ (M=Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g and 1890 mAh/cm$^3$).

A nitride containing lithium and a transition metal is preferably used, in which case lithium ions are contained in the negative electrode active material and thus the negative electrode active material can be used in combination with a material for a positive electrode active material which does not contain lithium ions, such as $V_2O_5$ or $Cr_3O_8$. In the case of using a material containing lithium ions as a positive electrode active material, the nitride containing lithium and a transition metal can be used for the negative electrode active material by extracting the lithium ions contained in the positive electrode active material in advance.

Alternatively, a material which causes a conversion reaction can be used as the negative electrode active material. For example, a transition metal oxide with which an alloying reaction with lithium is not caused, such as cobalt oxide (CoO), nickel oxide (NiO), or iron oxide (FeO), may be used for the negative electrode active material. Other examples of the material which causes a conversion reaction include oxides such as $Fe_2O_3$, CuO, $Cu_2O$, $RuO_2$, and $Cr_2O_3$, sulfides such as $CoS_{0.89}$, NiS, or CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$. Note that any of the fluorides can be used as a positive electrode active material because of its high potential.

The negative electrode active material layer 205 may further include a binder for increasing adhesion of active materials, a conductive additive for increasing the conductivity of the negative electrode active material layer 205, and the like in addition to the above-described negative electrode active materials.

As an electrolyte in the electrolytic solution 208, a material which has carrier ion mobility and contains carrier ions is used. In the case where carrier ions are lithium ions, typical examples of the electrolyte are lithium salts such as $LiPF_6$, $LiClO_4$, $Li(FSO_2)_2N$, $LiAsF_6$, $LiBF_4$, $LiCF_3SO_3$, $Li(CF_3SO_2)_2N$, and $Li(C_2F_5SO_2)_2N$. One of these electrolytes may be used alone or two or more of them may be used in an appropriate combination and in an appropriate ratio. In order to stabilize a reaction product, a small amount (1 wt %) of vinylene carbonate (VC) may be added to the electrolytic solution so that the decomposition amount of the electrolytic solution is further reduced.

As a solvent of the electrolytic solution 208, a material in which carrier ions can transfer is used. As the solvent of the electrolytic solution, an aprotic organic solvent is preferably used. Typical examples of aprotic organic solvents include ethylene carbonate (EC), propylene carbonate, dimethyl carbonate, diethyl carbonate (DEC), γ-butyrolactone, acetonitrile, dimethoxyethane, tetrahydrofuran, and the like, and one or more of these materials can be used. When a gelled high-molecular material is used as the solvent for the electrolytic solution, safety against liquid leakage and the like is improved. Further, the storage battery can be thinner and more lightweight. Typical examples of the gelled high-molecular material include a silicone gel, an acrylic gel, an acrylonitrile gel, a poly(ethylene oxide)-based gel, a poly(propylene oxide)-based gel, a gel of a fluorine-based polymer, and the like. Alternatively, the use of one or more of ionic liquids (room temperature molten salts) which have features of non-flammability and non-volatility as a solvent of the electrolytic solution can prevent the storage battery from exploding or catching fire even when the storage battery internally shorts out or the internal temperature increases owing to overcharging or the like.

As the separator 207, an insulator can be used, for example. Examples of the insulator include cellulose (paper), polypropylene with pores, and polyethylene with pores.

In the secondary battery, a thin flexible film (such as a laminate film) is used as an exterior body. The laminate film refers to a stacked film of a base film and an adhesive synthetic resin film, or a stacked film of two or more kinds of films. For the base film, polyester such as PET or PBT, polyamide such as nylon 6 or nylon 66, an inorganic film formed by evaporation, or paper may be used. For the adhesive synthetic resin film, polyolefin such as PE or PP, an acrylic-based synthetic resin, an epoxy-based synthetic resin, or the like may be used. An object is laminated with the laminate film by thermocompression bonding using a laminating apparatus. Note that an anchor coat agent is preferably applied as pretreatment for the laminating step so that the adhesion between the laminate film and the object can be increased. As the anchor coat agent, an isocyanate-based material or the like may be used.

In the above structure, the exterior body 209 of the secondary battery can change its form with a radius of curvature greater than or equal to 30 mm, preferably greater than or equal to 10 mm. An exterior body of a secondary battery is formed of one or two films. In the case of a secondary battery having a layered structure, a cross-sectional structure of the battery that is bent is surrounded by two curves of the film serving as the exterior body.

Figure 26A:
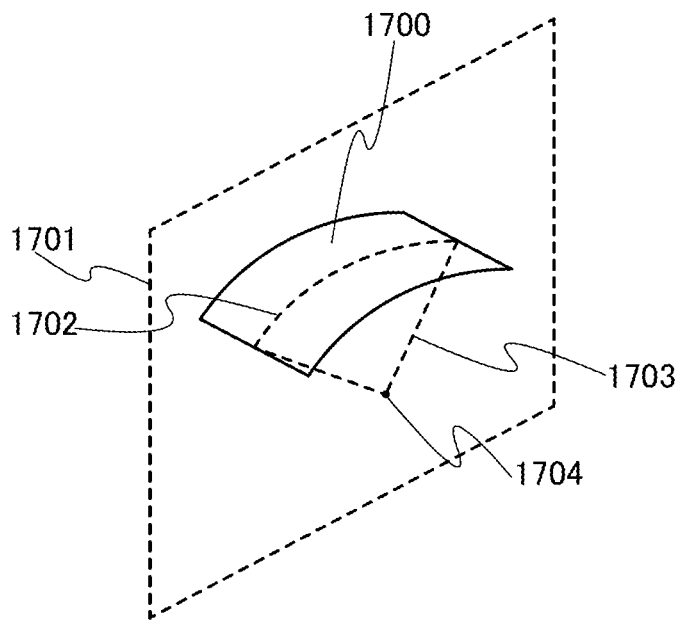
FIGS. 26A to 26C illustrate the radius of curvature of a surface.
Figure 26B:
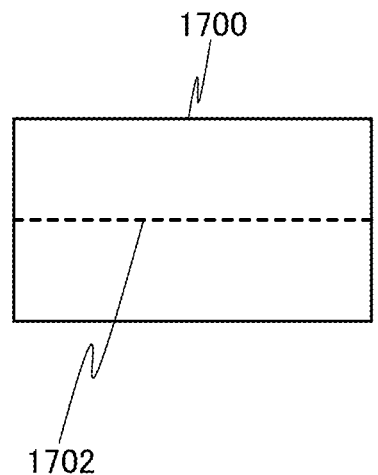
Figure 26C:
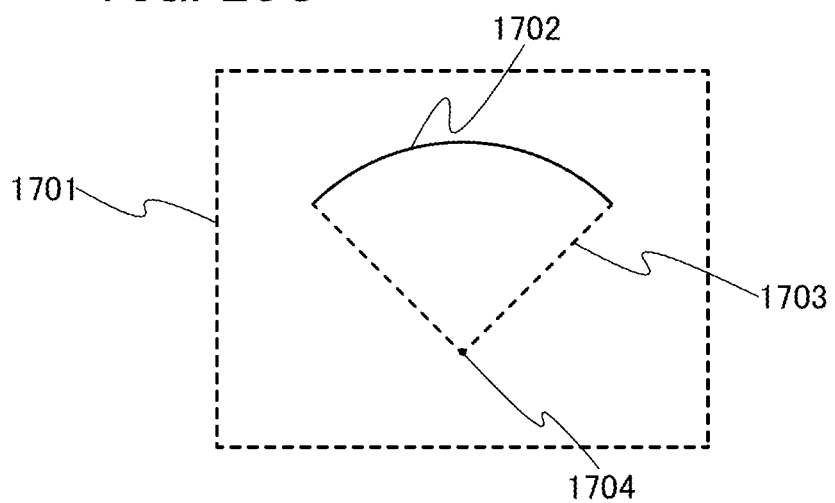

A description is given of the radius of curvature of a surface with reference to FIGS. 26A to 26C. In FIG. 26A, on a plane surface 1701 along which a curved surface 1700 is cut, part of a curve 1702 forming the curved surface 1700, is approximate to an arc of a circle, and the radius of the circle is referred to as a radius of curvature 1703 and the center of the circle is referred to as a center of curvature 1704. FIG. 26B is a top view of the curved surface 1700. FIG. 26C is a cross-sectional view of the curved surface 1700 taken along the plane surface 1701. When a curved surface is cut by a plane, the radius of curvature of a curve in a cross section differs depending on the angle between the curved surface and the plane or on the cut position, and the smallest radius of curvature is defined as the radius of curvature of a surface in this specification and the like.

In the case of curving a secondary battery in which a component 1805 including electrodes and an electrolytic solution is sandwiched between two films as exterior bodies, a radius 1802 of curvature of a film 1801 close to a center 1800 of curvature of the secondary battery is smaller than a radius 1804 of curvature of a film 1803 far from the center 1800 of curvature (FIG. 27A). When the secondary battery is curved and has an arc-shaped cross section, compressive stress is applied to a surface of the film on the side closer to the center 1800 of curvature and tensile stress is applied to a surface of the film on the side far from the center 1800 of curvature (FIG. 27B). However, by forming a pattern of projections and depressions on surfaces of the exterior bodies, influence of distortion can be reduced to be acceptable even when the compressive stress and the tensile stress are applied. For this reason, the secondary battery can change its form such that the exterior body on the side closer to the center of curvature has a curvature radius greater than or equal to 30 mm, preferably greater than or equal to 10 mm.

Note that the cross-sectional shape of the secondary battery is not limited to a simple arc shape, and the cross section can be partially arc-shaped; for example, a shape illustrated in FIG. 27C, a wavy shape illustrated in FIG. 27D, and an S shape can be used. When the curved surface of the secondary battery has a shape with a plurality of centers of curvature, the secondary battery can change its form such that a curved surface with the smallest radius of curvature among radii of curvature with respect to the plurality of centers of curvature, which is a surface of the exterior body on the side closer to the center of curvature, has a curvature radius greater than or equal to 10 mm, preferably greater than or equal to 30 mm.

This embodiment can be freely combined with any of the other embodiments.

REFERENCE NUMERALS

100: electronic device, 102: display portion, 103: FPC, 103a: FPC, 104: IC, 106: circuit board, 107: circuit board, 108: storage battery, 110: display panel, 111: display region, 112: display region, 113: display region, 114: display region, 115: display region, 120: substrate, 125: support, 126: housing, 131: side, 132: side, 133: side, 135: cut, 138: notch portion, 141: driver circuit, 142: driver circuit, 143: driver circuit, 145: wiring, 146: wiring, 151: display region, 152: display region, 153: display region, 161: icon, 162: text data, 164: text data, 167: image data, 201: positive electrode current collector, 202: positive electrode active material layer, 203: positive electrode, 204: negative electrode current collector, 205: negative electrode active material layer, 206: negative electrode, 207: separator, 208: electrolytic solution, 209: exterior body, 400: electronic device, 401: charger, 510: positive electrode lead electrode, 511: negative electrode lead electrode, 801: substrate, 803: substrate, 804: light-emitting portion, 806: driver circuit portion, 808: FPC, 811: adhesive layer, 813: insulating layer, 814: conductive layer, 815: insulating layer, 816: conductive layer, 817: insulating layer, 817a: insulating layer, 817b: insulating layer, 820: transistor, 821: insulating layer, 822: transistor, 823: sealing layer, 824: sealing layer, 825: connector, 827: spacer, 830: light-emitting element, 831: lower electrode, 833: EL layer, 835: upper electrode, 841: adhesive layer, 843: insulating layer, 845: coloring layer, 847: light-blocking layer, 849: overcoat, 857: conductive layer, 857a: conductive layer, 857b: conductive layer, 1700: curved surface, 1701: plane surface, 1702: curved surface, 1703: radius of curvature, 1704: center of curvature, 1800: center of curvature, 1801: film, 1802: radius of curvature, 1803: film, 1804: radius of curvature.

This application is based on Japanese Patent Application serial no. 2014-213097 filed with Japan Patent Office on Oct. 17, 2014, the entire contents of which are hereby incorporated by reference.

The invention claimed is:

1. An electronic device to be worn on an arm comprising: a support including a first curved surface, a second curved surface which is opposite to the first curved surface, and a third curved surface which is between the first curved surface and the second curved surface; a display portion including a first display region and a second display region; and a storage battery having flexibility between the first curved surface and the second curved surface, wherein the first display region is on the first curved surface, wherein the second display region is on the third curved surface, wherein the first display region and the storage battery overlap with each other, wherein the first display region and the second display region are continuously provided, and wherein part of the second display region is protruded toward the second curved surface of the support, wherein an inner arc of the first curved surface and an outer arc of the second curved surface face each other in the same direction with the storage battery interposed therebetween.

2. The electronic device according to claim 1, wherein the first display region has a larger surface area than the second display region.

3. The electronic device according to claim 1, wherein the display portion is in contact with the first curved surface and the second curved surface.

4. The electronic device according to claim 1, wherein the electronic device is configured to be worn such that the second curved surface is in contact with the arm.

5. The electronic device according to claim 1, wherein the display portion includes a touch sensor on the first display region.

6. The electronic device according to claim 1, wherein an exterior body of the storage battery is a laminate film.

7. An electronic device to be worn on an arm comprising: a support including a first curved surface, a second curved surface which is opposite to the first curved surface, and a third curved surface which is between the first curved surface and the second curved surface; a display portion including a first display region and a second display region; and a storage battery having flexibility between the first curved surface and the second curved surface, wherein the storage battery is electrically connected to the display portion by a circuit board, wherein the first display region is on the first curved surface, wherein the second display region is on the third curved surface, wherein the first display region and the storage battery overlap with each other, wherein the first display region and the second display region are continuously provided, and wherein part of the second display region is protruded toward the second curved surface of the support, wherein an inner arc of the first curved surface and an outer arc of the second curved surface face each other in the same direction with the storage battery interposed therebetween.

8. The electronic device according to claim 7, wherein the first display region has a larger surface area than the second display region.

9. The electronic device according to claim 7, wherein the display portion is in contact with the first curved surface and the second curved surface.

10. The electronic device according to claim 7, wherein the electronic device is configured to be worn such that the second curved surface is in contact with the arm.

11. The electronic device according to claim 7, wherein the display portion includes a touch sensor on the first display region.

12. The electronic device according to claim 7, wherein an exterior body of the storage battery is a laminate film.

13. The electronic device according to claim 7,
wherein the circuit board comprises a first circuit board and a second circuit board,
wherein the first circuit board is electrically connected to the display portion,
wherein the second circuit board is electrically connected to the first circuit board, and
wherein the second circuit board is electrically connected to the storage battery.

* * * * *